United States Patent
Inoue

(10) Patent No.: US 10,523,566 B2
(45) Date of Patent: Dec. 31, 2019

(54) MEMORY DEVICE

(71) Applicant: POCO-APOCO NETWORKS CO. LTD., Osaka (JP)

(72) Inventor: Kazunari Inoue, Osaka (JP)

(73) Assignee: POCO-APOCO NETWORKS CO., LTD., Osaka-Shi, Osaka (JP)

( * ) Notice: Subject to any disclaimer, the term of this patent is extended or adjusted under 35 U.S.C. 154(b) by 14 days.

(21) Appl. No.: 15/753,826

(22) PCT Filed: Aug. 9, 2016

(86) PCT No.: PCT/JP2016/073477
§ 371 (c)(1),
(2) Date: Feb. 20, 2018

(87) PCT Pub. No.: WO2017/030054
PCT Pub. Date: Feb. 23, 2017

(65) Prior Publication Data
US 2018/0248800 A1    Aug. 30, 2018

(30) Foreign Application Priority Data

Aug. 18, 2015  (JP) ................................ 2015-161228
Oct. 22, 2015  (JP) ................................ 2015-207863

(51) Int. Cl.
*H04L 12/743* (2013.01)
*G06F 12/00* (2006.01)
(Continued)

(52) U.S. Cl.
CPC .......... *H04L 45/7453* (2013.01); *G06F 12/00* (2013.01); *G11C 15/04* (2013.01); *H04L 43/026* (2013.01)

(58) Field of Classification Search
CPC .......... G06F 12/00; G11C 15/00; G11C 15/04; H04L 43/026; H04L 45/7453
See application file for complete search history.

(56) References Cited

U.S. PATENT DOCUMENTS 5,781,549 A * 7/1998 Dai ...................... H04L 12/5601
                                                                     370/398
6,987,762 B2   1/2006 Shiota
(Continued)

FOREIGN PATENT DOCUMENTS

JP    2001-251351 A    9/2001
JP    2012-027998 A    2/2012
(Continued)

OTHER PUBLICATIONS

Office Action issued to TW Patent Application No. 105125881, dated Jul. 24, 2017, 5 pages.
(Continued)

*Primary Examiner* — Zhuo H Li
(74) *Attorney, Agent, or Firm* — Muncy, Geissler, Olds & Lowe, P.C.

(57) ABSTRACT

A memory device is configured as single chip to achieve routing control, bandwidth control, traffic monitoring, buffering, and access control of network functions. The memory device includes a search unit that includes a first memory unit and performs a search operation by searching, from the first memory unit, a piece of data corresponding to an input search key, a statistical information processing unit that includes a second memory unit that stores statistical information including the input search key, with which the piece of data has been successfully searched by the search unit, and an address of the piece of data in the first memory unit, and an arithmetic operation unit that updates the statistical information when the search unit successfully searches the pieces of data corresponding to the input search key.

13 Claims, 17 Drawing Sheets

(51) Int. Cl.
*G06F 12/14* (2006.01)
*H04L 12/933* (2013.01)
*H04L 12/863* (2013.01)
*H04L 12/939* (2013.01)
*H04L 12/861* (2013.01)
*H04L 12/26* (2006.01)
*G11C 15/00* (2006.01)
*G11C 15/04* (2006.01)
*G06F 12/0875* (2016.01)

(56) References Cited

U.S. PATENT DOCUMENTS

| | | |
|---|---|---|
| 8,352,677 B2 | 1/2013 | Sasao |
| 8,625,360 B2 | 1/2014 | Iwamoto et al. |
| 8,806,087 B2 | 8/2014 | Anzai |
| 9,385,951 B2 | 7/2016 | Shiraki |
| 2001/0021189 A1 | 9/2001 | Shiota |
| 2002/0169937 A1 | 11/2002 | Kagawa |
| 2010/0091787 A1 | 4/2010 | Muff |
| 2010/0228911 A1 | 9/2010 | Sasao |
| 2011/0310648 A1 | 12/2011 | Iwamoto et al. |
| 2012/0096193 A1 | 4/2012 | Anzai |
| 2013/0294231 A1 | 11/2013 | Nodir et al. |
| 2013/0304915 A1 | 11/2013 | Kawai |
| 2014/0286175 A1* | 9/2014 | Shiraki ............... H04L 45/74 370/241 |
| 2015/0019563 A1* | 1/2015 | Wildman ............ G11C 15/00 707/747 |

FOREIGN PATENT DOCUMENTS

| | | |
|---|---|---|
| JP | 4934825 B2 | 5/2012 |
| JP | 2013-038536 A | 2/2013 |
| JP | 2014-187447 A | 10/2014 |
| KR | 20020086200 A | 11/2002 |
| KR | 10-2010-0042214 A | 4/2010 |
| KR | 20130126833 A | 11/2013 |
| WO | WO 97/31455 A1 | 8/1997 |
| WO | WO 2011/007437 A1 | 12/2012 |
| WO | WO 2012/098786 A1 | 6/2014 |

OTHER PUBLICATIONS

Office Action issued in KR Patent Application No. KR-10-2018-7007086, dated Oct. 18, 2019, 6 pages.

* cited by examiner

MEMORY DEVICE

TECHNICAL FIELD

The present invention relates to a memory device.

BACKGROUND ART

In the related art, personal computers (hereinafter appropriately abbreviated as "PCs") and servers are IT devices which are manufactured and sold by limited manufacturers. Since components such as processors and memories which are used in devices have been recently generalized, the PCs or the servers have changed into IT devices which can be assembled by anyone. In PCs or servers in General, application software such as an OS is commodified, and such PCs or servers employ an open platform for which anyone can be a developer or a technical proposer. Like systems including the PCs or servers in the present day, a system of which casings are different but configurations of internal specifications are visualized are referred to as "White Box" or the like.

Network devices such as routers or switches (for example, see Patent Documents 1 to 3) were in a special IT device market which are dominated by only limited manufacturers, but as a new term "network functions virtualization (NFV)" emerges in recent years, the recent trend of the network devices are similar to the recent trend of the PCs or servers described above. For example, low cost type enterprise-grade models have gradually employed an open platform which can be manufactured by anyone by commodification of processors or memories.

Patent Document 1: Japanese Unexamined Patent Application, Publication No. 2013-38536
Patent Document 2: Japanese Unexamined Patent Application, Publication No. 2012-27998
Patent Document 3: Japanese Patent No. 4934825

DISCLOSURE OF THE INVENTION

Problems to be Solved by the Invention

However, on the occasion of commodification of NFV or networks, it is desired to extend network functions such as extending routing control including search. In this case, as illustrated in FIG. 15, this requires multiple expensive components consuming high power, such as special memories.

FIG. 15 is a block diagram illustrating a configuration example of an information processing system according to related art for implementing network functions. For example, the information processing system according to the related art illustrated in FIG. 15 is mounted on a board which is incorporated into a server or a PC. The information processing system according to the related art includes a network processor 12, a CPU 13, a plurality of (four in the example illustrated in FIG. 15) communication devices 14a to 14d, a TCAM 501, an SRAM 502, and a DRAM 503. When the function of the network processor 12 is extended, various memories are required for the information processing system according to the related art. For example, the TCAM 501 is used to implement routing control and traffic monitoring, the SRAM 502 is used to implement routing control, bandwidth control, and traffic monitoring, and the DRAM 503 that can have a large capacity is used as a buffer. The TCAM 501, the SRAM 502, and the DRAM 503 are components with high prices and high power consumption.

The invention is made in consideration of the above-mentioned circumstances and an object thereof is to easily realize extension of network functions with low cost and low power consumption on the occasion of NFV or commodification of networks.

Means for Solving the Problems

A memory device according to an aspect of the invention is a memory device that is configured as single chip, in which the memory device allows at least routing control, bandwidth control, traffic monitoring, buffering, and access control of network functions to function.

Here, the memory device may include: a search unit that includes a first memory unit and performs a search operation of referring to an input search key for data stored in the first memory unit; a statistical information processing unit that correlates an address of the first memory unit with a search key which is hit by the search unit and includes a second memory unit that stores statistical information of the address; and an arithmetic operation unit that updates the statistical information whenever the search unit hits.

The search unit may have a function of changing a bit width of a search key.

The search unit may have a function of outputting a determination signal indicating whether writing of information has succeeded or failed.

The search unit may selectively perform the access control using a white list method and the access control using a black list method.

The memory device may be provided to be connected to each individual device in an information processing system including individual devices constituting a network and a network controller controlling the individual devices, and the memory device may have: a function of monitoring traffic of one connected individual device of the individual devices, acquiring data, and transmitting the acquired data to the network controller; and a function of receiving control information and controlling one connected individual device of the individual devices on the basis of the control information when data of the individual devices is analyzed and the control information for the individual devices is generated and transmitted by the network controller.

The memory device may further include: a memory unit; a network function unit that implements the network functions; and a selector unit that switches between a first route including the memory unit and the network function unit and a second route including the memory unit.

The selector unit may be implemented using at least one of a metal mask and an address key.

The network function unit may include a comparator group for a test mode of the memory unit.

Effects of the Invention

According to the invention, it is possible to easily realize extension of a network function with low cost and low power consumption on the occasion of NFV or commodification of networks.

PREFERRED MODE FOR CARRYING OUT THE INVENTION

Hereinafter, embodiments of the invention will be described with reference to the accompanying drawings.

Figure 1:
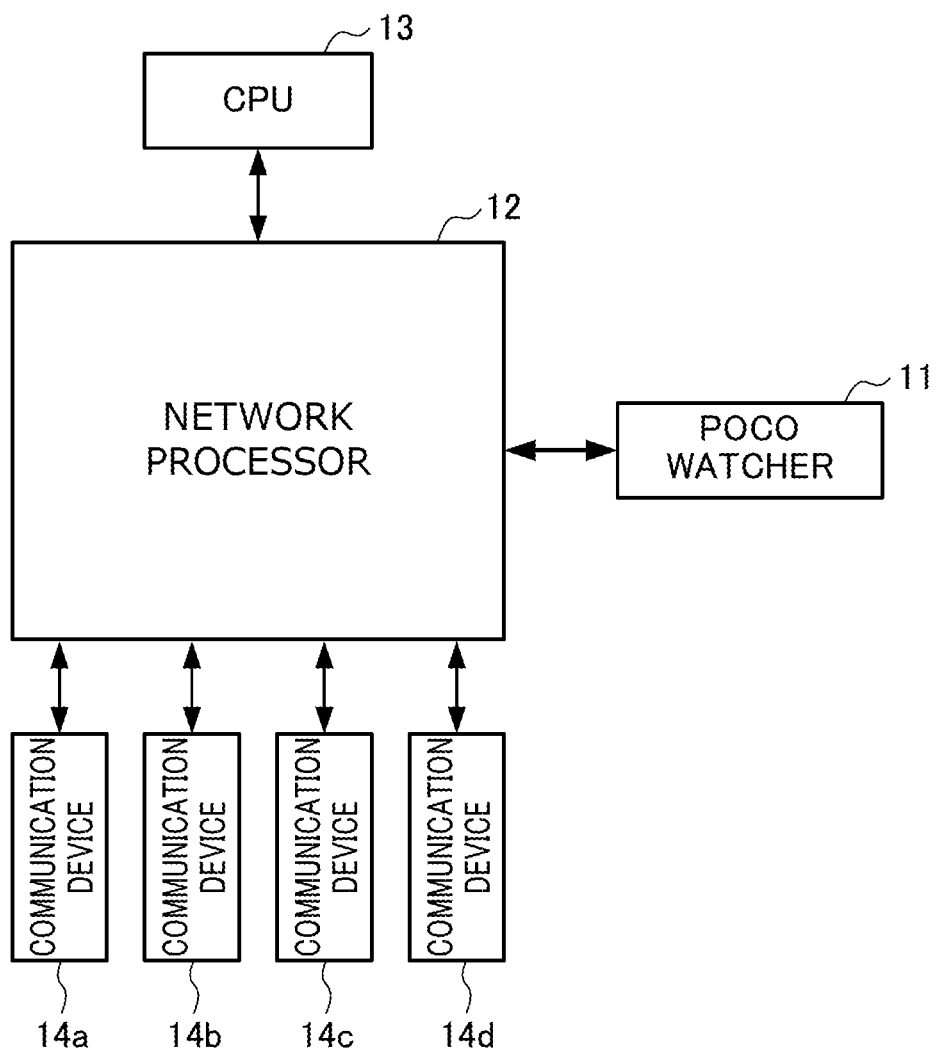
FIG. 1 is a block diagram illustrating a configuration example of an information processing system according to an embodiment of the invention.

FIG. 1 is a block diagram illustrating a configuration example of an information processing system according to an embodiment of the invention. For example, the information processing system illustrated in FIG. 1 is mounted on a board which is incorporated into a server or a PC. The information processing system includes a Poco Watcher 11 which is an example of an electronic device to which the invention is applied, a network processor 12, a CPU 13, and a plurality of (four in the example illustrated in FIG. 1) communication devices 14a to 14d.

Figure 15:
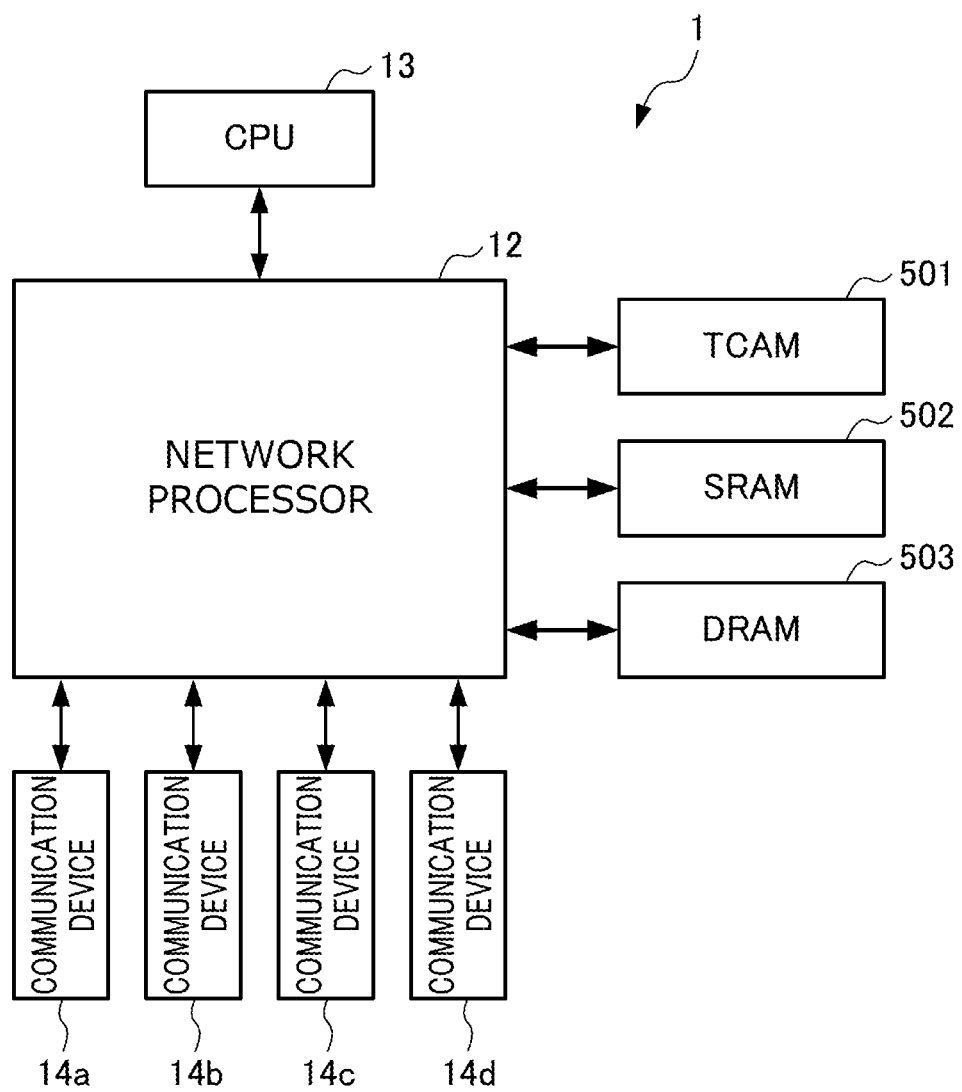
FIG. 15 is a block diagram illustrating a configuration example of an information processing system according to the related art for implementing network functions.

When the function of the network processor 12 is extended, various memories were necessary in the related art as described above. For example, in the example of the related art illustrated in FIG. 15, the TCAM 501 is used to implement routing control and traffic monitoring, the SRAM 502 is used to implement routing control, bandwidth control, and traffic monitoring, and the DRAM 503 having a capacity capable of increasing is used as a buffer. On the other hand, in the information processing system according to this embodiment, since the Poco Watcher 11 is configured as a single chip allowing DRAM processes, it is possible to cope with a buffer with a large capacity. Accordingly, as illustrated in FIG. 1, it is possible to extend the function of the network processor 12 using only a configuration in which the Poco Watcher 11 is connected to the network processor 12.

The configuration of the information processing system is not particularly limited to the configuration illustrated in FIG. 1, as long as it is a configuration in which the network processor 12 and the Poco Watcher 11 can communicate with each other.

Figure 2A:
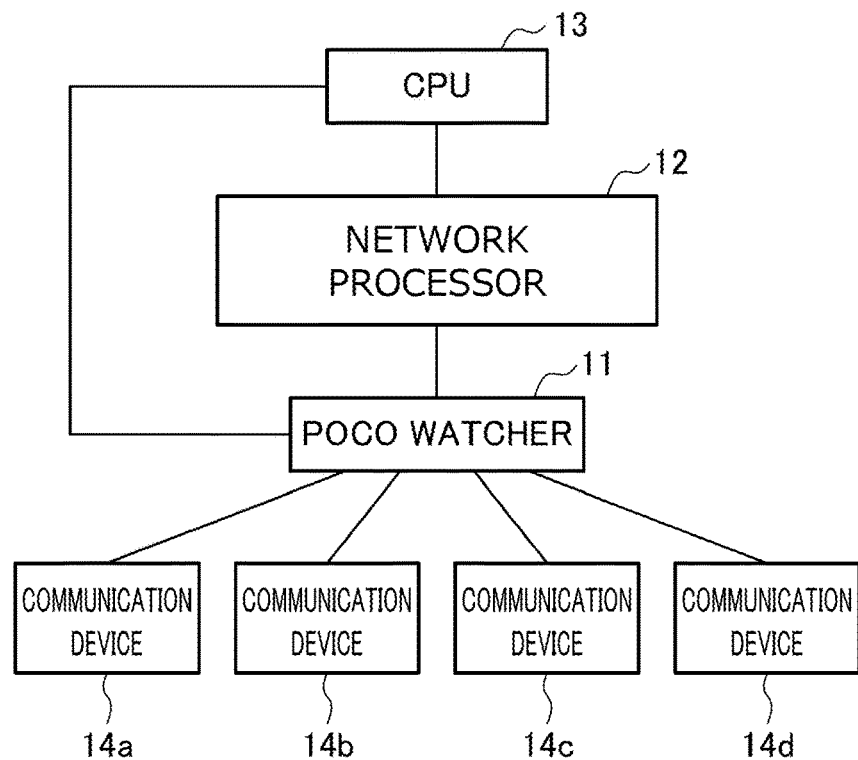
FIGS. 2A and 2B are block diagrams illustrating a configuration example of the information processing system according to the embodiment of the invention which is different from the example illustrated in FIG. 1.
Figure 2B:
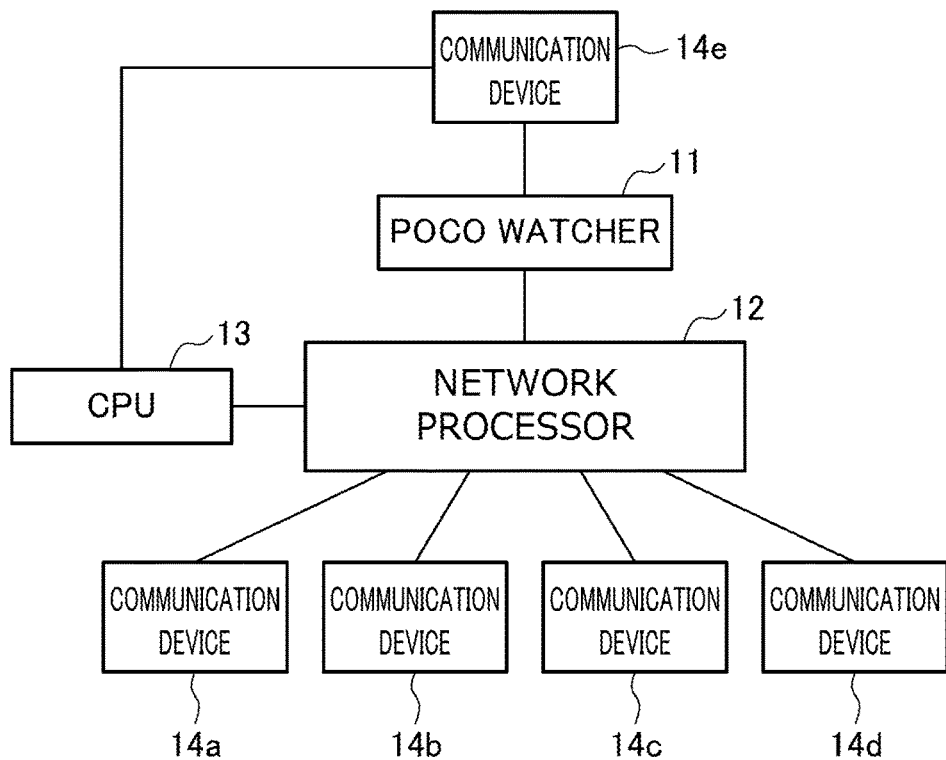

FIGS. 2A and 2B are block diagrams illustrating a configuration example of the information processing system according to the embodiment of the invention which is different from the example illustrated in FIG. 1. The information processing system in the example illustrated in FIG. 2A is different from the example illustrated in FIG. 1, in that the communication devices 14a to 14d are connected to the Poco Watcher 11. The information processing system in the example illustrated in FIG. 2B is different from the example illustrated in FIG. 1, in that a communication device 14e which is connected to a router which is not illustrated is connected to the Poco Watcher 11. The configurations illustrated in FIGS. 2A and 2B are only examples, and for example, although not illustrated, two Poco Watchers 11 may be provided and the Poco Watchers 11 may be respectively simultaneously inserted between the communication device 14e and the network processor 12 and between the network processor 12 and the communication devices 14a to 14d.

Figure 3:
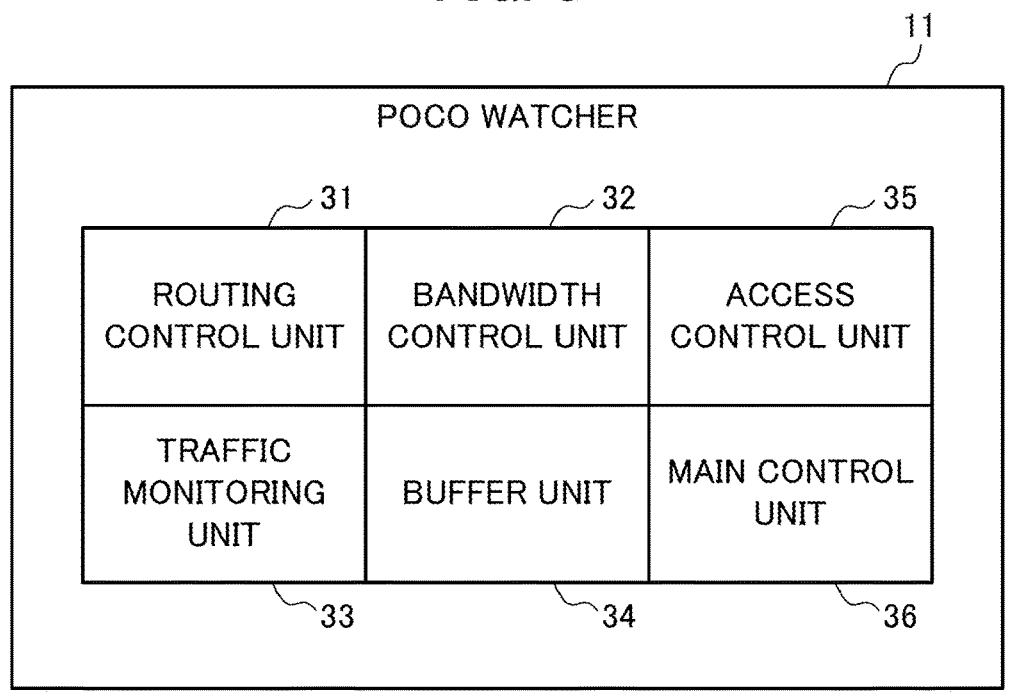
FIG. 3 is a functional block diagram illustrating implementation of network functions of functions of a Poco Watcher of the information processing system illustrated in FIG. 1 or FIGS. 2A and 2B.

FIG. 3 is a functional block diagram illustrating implementation of network functions of functions of the Poco Watcher 11. As illustrated in FIG. 3, the Poco Watcher 11 allows a routing control unit 31, a bandwidth control unit 32, a traffic monitoring unit 33, a buffer unit 34, an access control unit 35, and a main control unit 36 to function.

The routing control unit 31 implements a function equivalent to the routing control which was implemented by the TCAM and the HS SRAM in the related art. The bandwidth control unit 32 implements a function equivalent to the bandwidth control which was implemented by the HS SRAM and the LLDRAM in the related art. The traffic monitoring unit 33 implements a function equivalent to the traffic monitoring which was implemented by the TCAM, the HS SRAM counter, and the ALU in the related art. The buffer unit 34 implements the buffering by a function equivalent to the DRAM in the related art. The access control unit 35 implements a function equivalent to the access control which has been implemented in the related art. The main control unit 36 controls the entire Poco Watcher 11 including the routing control unit 31 to the access control unit 35.

Figure 4:
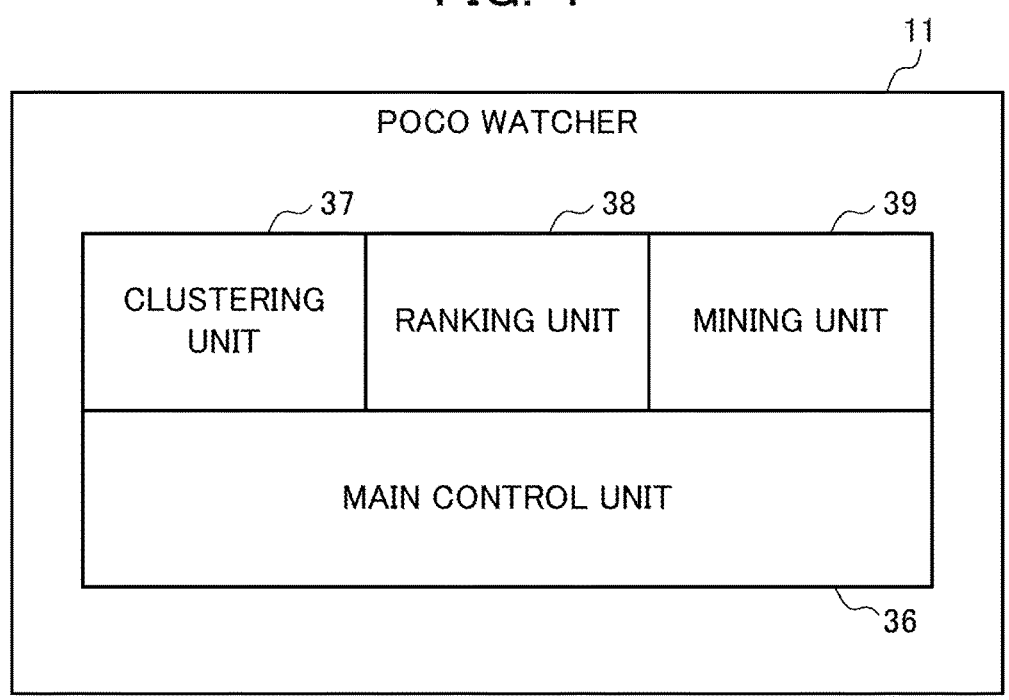
FIG. 4 is a functional block diagram illustrating implementation of a mining function of the functions of the Poco Watcher of the information processing system illustrated in FIG. 1 or FIGS. 2A and 2B.

FIG. 4 is a functional block diagram illustrating implementation of a mining function of the functions of the Poco Watcher 11. As illustrated in FIG. 4, the Poco Watcher 11 allows a clustering unit 37, a ranking unit 38, and a mining unit 39 to function in addition the main control unit 36.

The clustering unit 37 implements a function equivalent to clustering control which has been implemented in the related art. The ranking unit 38 implements a function equivalent to ranking control which has been implemented in the related art. The mining unit 39 implements a function equivalent to mining which has been implemented in the related art.

Figure 5:
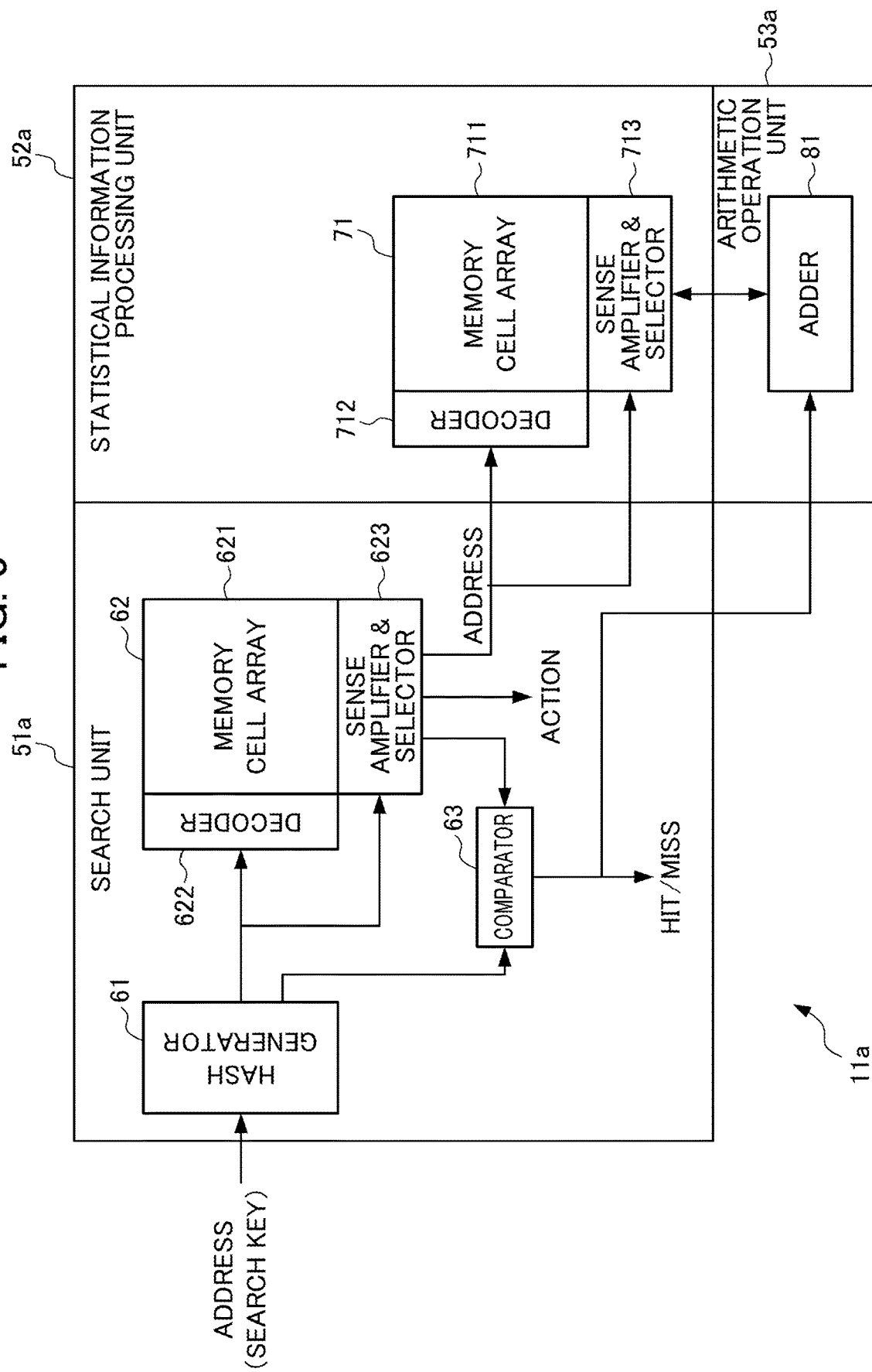
FIG. 5 is a diagram illustrating an example of a hardware configuration which operates when a routing control unit or a traffic monitoring unit illustrated in FIG. 3 or a clustering unit or a ranking unit illustrated in FIG. 4 functions in the hardware configuration of the Poco Watcher of the information processing system illustrated in FIG. 1 or FIGS. 2A and 2B.
Figure 6:
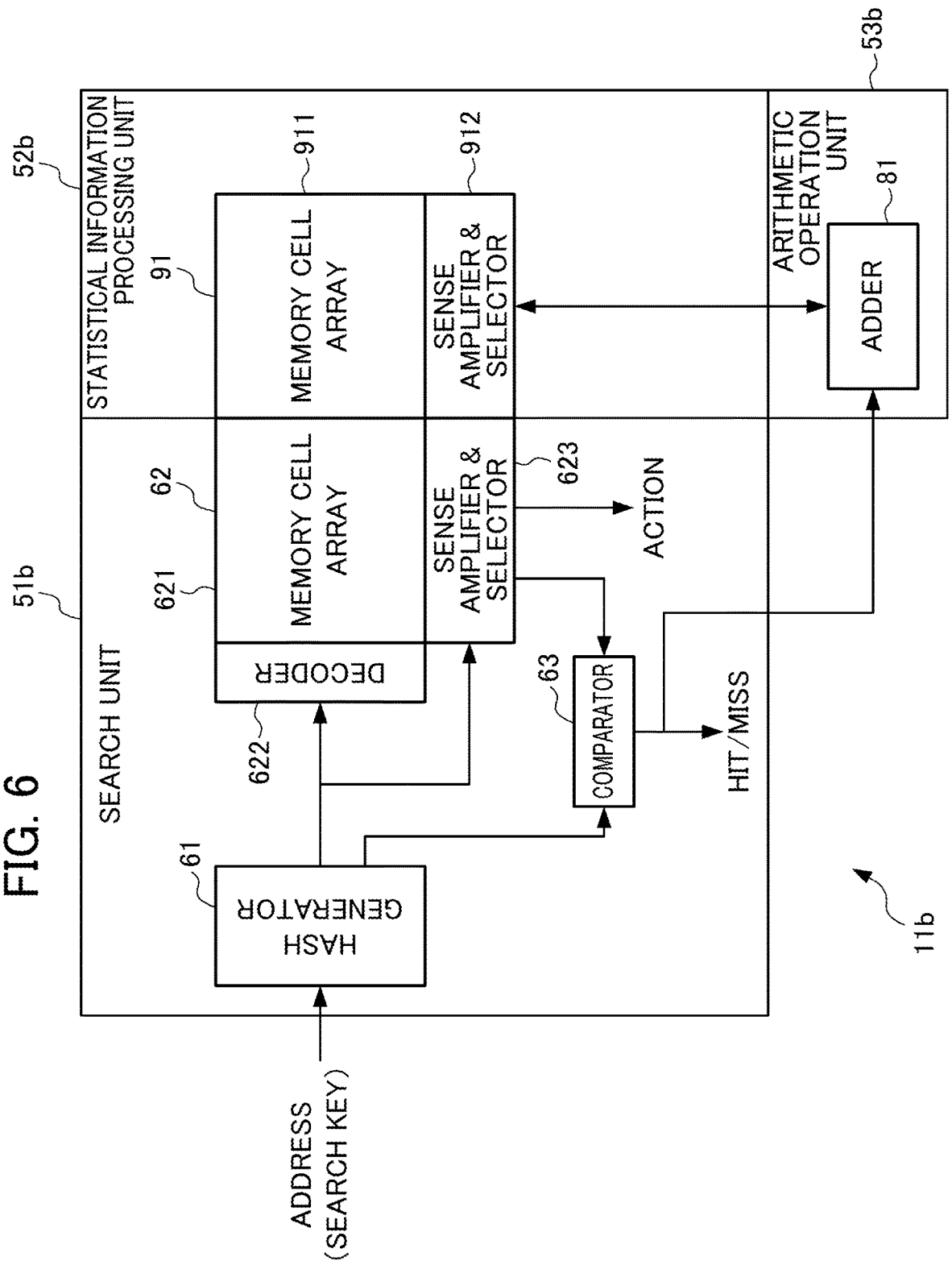
FIG. 6 is a diagram illustrating an example of a hardware configuration which operates when the routing control unit or the traffic monitoring unit illustrated in FIG. 3 or the clustering unit or the ranking unit illustrated in FIG. 4 functions in the hardware configuration of the Poco Watcher of the information processing system illustrated in FIG. 1 or FIGS. 2A and 2B which is different from the example illustrated in FIG. 5.

FIG. 5 illustrates an example of a hardware configuration which operates when the routing control unit 31 or the traffic monitoring unit 33 illustrated in FIG. 3 or the clustering unit 37 or the ranking unit 38 illustrated in FIG. 4 functions in the hardware configuration of the Poco Watcher 11. FIG. 6 illustrates an example of a hardware configuration which operates when the routing control unit 31 or the traffic monitoring unit 33 illustrated in FIG. 3 or the clustering unit 37 or the ranking unit 38 illustrated in FIG. 4 functions in the hardware configuration of the Poco Watcher 11 which is different from the example illustrated in FIG. 5. In order to clearly distinguish the example illustrated in FIG. 5 and the example illustrated in FIG. 6, the Poco Watcher 11 in the example illustrated in FIG. 5 is particularly referred to as a "Poco Watcher 11a" and the Poco Watcher 11 in the example illustrated in FIG. 6 is particularly referred to as a "Poco Watcher 11b".

The Poco Watcher 11a in the example illustrated in FIG. 5 includes a search unit 51a, a statistical information processing unit 52a, and an arithmetic operation unit 53a.

The search unit 51a is a so-called search engine and includes a hash generator 61, a memory unit 62, and a comparator 63. Here, search refers to an operation of referring to a desired search key (a data string to be searched for) for data stored in a storage device such as a memory (the memory unit 62 in the example illustrated in FIG. 5). A case in which a search key has been found in the memory unit 62 is defined as a hit (a search hit), and a case in which a search key has not been found is defined as a miss (a search miss). After the search has hit, an action (or a rule) is output from the memory unit 62. Specifically, for example, it is assumed that PortB (in which a destination is the communication device 14b) is defined as an action when a search key 55_23_75_A4_53_10_89_bd is stored in the memory unit 62 and a hit occurs. In this way, when the search key 55_23_75_A4_53_10_89_bd is input to the search unit 51a, the search key is searched for from the memory unit 62 to be hit and PortB is output as an action.

When various applications causing the routing control unit 31 or the traffic monitoring unit 33 illustrated in FIG. 3 or the clustering unit 37 or the ranking unit 38 illustrated in FIG. 4 to function are executed, this search operation is necessary. The search operation (command) cannot be performed with a hardware configuration using a normal memory in the related art (a configuration including only the memory unit 62 illustrated in FIG. 5). Accordingly, in the related art, when a network IP address is searched for, or the like, a special memory called TCAM 501 (FIG. 15) is used to perform a search operation. The TCAM 501 performs a search operation by providing an address comparator to a memory cell side and performing a process of comparing data stored in the memory cell with the search key for all memory cells. The search using the TCAM 501 has a problem in that power consumption is very great to simultaneously access all the memory cells in parallel.

Therefore, in this embodiment, the search unit 51a that can perform a search operation is provided in a single chip called Poco Watcher 11 so as to perform a search operation without providing a special memory such as the TCAM 501.

Here, the memory unit 62 in the search unit 51a has the same hardware configuration as a normal memory. That is, the memory unit 62 includes a memory cell array 621, a decoder 622, and a sense amplifier & selector 623. The decoder 622 decodes encoded data (an input address). Here, the decoder 622 develops a signal of a binary number. For example, a value of N bits is developed into 2N by the decoder 622. Then, the decoder 622 selects a position of the memory cell array 621 on the basis of the developed value, and data is written to the selected position or data is read from the selected position. The sense amplifier & selector 623 includes a sense amplifier that amplifies data read from the memory cell array 621 and a selector that selects data read from the memory cell array 621 in accordance with an address signal. In this way, all operations (commands) which can be performed by the memory unit 62 itself are writing and reading and the memory unit has no search function (command). Accordingly, like the Poco Watcher 11 in this embodiment, when a search operation is implemented using a normal memory (the memory unit 62), an input search key needs to be handled as an address. Action data can be acquired from the memory by using an address of the memory as a search key, defining data of the memory as actions, and inputting search data as an address. However, according to this method, when a bit width which is used as a search key is long, there is a problem in that a memory capacity becomes enormous. For example, in the case of a search key with a length of 64 bits, the total capacity of the memory is 2^64 (≈16×10^18), which is much larger than a memory capacity which can be implemented in the semiconductor technology on the occasion of filing the present application.

Therefore, the search unit 51a of this embodiment further includes the hash generator 61 in addition to the memory unit 62. The hash generator 61 reduces a bit length of an input search key using a hash function. For example, the hash generator 61 compresses an input of a search key with a length of 64 bits to an output with a width of 16 bits. In this way, the search unit 51a of this embodiment reduces a bit length which can be searched using the hash generator 61 therein and enables a search operation in consideration of a limit or restriction of a mounting capacity of the memory unit 62.

Since the search key is compressed, there is a problem in that the address cannot be distinguished from another address. In order to solve this problem, the search unit 51a of this embodiment further includes the comparator 63 in addition to the hash generator 61 and the memory unit 62. At the time of reading from the memory cell array 621 via the sense amplifier & selector 623, the comparator 63 reads a stored search key in addition to an action result, compares the read search key with the input search key, and finally determines hit/miss. Patent Document 3 can be referred to for further details of the search unit 51*a*.

Here, in the Poco Watcher 11 illustrated in FIG. 5, the statistical information processing unit 52*a* and the arithmetic operation unit 53*a* are further provided in addition to the search unit 51*a*. This is because, when the Poco Watcher is configured using only the search unit 51*a*, there is a problem in that flexibility is insufficient for a search table that changes according to the application. For example, when IP addresses in network devices such as routers are listed in a search table, a capacity for storing data of about several millions of entries is required for IPv4. In the case of IPv6, since a search key has 64 bits but there are a large number of entries, a large search table is necessary. In recent information centric network (ICN) or content centric network/data centric network (CCN/DCN), a search key with a long bit length is required for controlling a route using a character string. In this way, there is a problem in that a single device such as the search unit 51*a* cannot cope with various applications for causing the routing control unit 31 or the traffic monitoring unit 33 illustrated in FIG. 3 or the clustering unit 37 or the ranking unit 38 illustrated in FIG. 4 to function or a waste occurs. In order to solve this problem, the Poco Watcher 11 illustrated in FIG. 5 is further provided with the statistical information processing unit 52*a* and the arithmetic operation unit 53*a* in addition to the search unit 51*a*.

For example, forwarding of a router or the like among applications of a search engine will be considered. The forwarding is implemented by the routing control by the routing control unit 31 illustrated in FIG. 3. The forwarding requires a process of determining a port number to which a packet is output from a destination address or the like which is described in the header of the packet. Here, it is assumed that a method of uniquely determining an output port number when a destination is determined is employed. For example, a table in which a relationship between a destination address and the like and an output port is described is used to determine a port number. In this case, when the same destination or the same output port is selected many times, congestion of traffic occurs. Since bypass of traffic is not possible in the method of unique determination, the forwarding employs a method of accumulating an amount of data of each flow and determining an output port in consideration of the amount of data thereof. According to this method, when a specific flow is hit many times, the output port is biased and congestion of traffic occurs. Accordingly, a process of counting the number of times of hit of each flow or an amount of traffic flowing is necessary to avoid such congestion. That is, a process of accumulating statistical information and constructing an efficient network is necessary.

In order to realize this process using a single chip, the Poco Watcher 11 illustrated in FIG. 5 is further provided with the statistical information processing unit 52*a* and the arithmetic operation unit 53*a* in addition to the search unit 51*a*.

The statistical information processing unit 52*a* includes a memory unit 71 to accumulate statistical information required for the above-mentioned process. The memory unit 71 has the same hardware configuration as a normal memory. That is, the memory unit 71 includes a memory cell array 711, a decoder 712, and a sense amplifier & selector 713. In this way, the memory unit 71 that is used to accumulate the statistical information is not a special memory cell but is a normal memory cell and thus the configuration illustrated in FIG. 5 can be implemented using a single chip such as the Poco Watcher 11. In order to accumulate the statistical information, the memory unit 71 accumulates information corresponding to flows which are hit by the search unit 51*a* (the search engine). That is, the memory unit 71 correlates an address with each hit search key and accumulates the statistic information in the addresses.

The arithmetic operation unit 53*a* receives a hit/miss determination result from the comparator 63, reads a unique address corresponding to a search key of a hit when the hit/miss determination result indicates the hit, accesses the memory unit 71 on the basis of the read address, and reads statistical information. The adder 81 of the arithmetic operation unit 53 updates the read statistical information by adding data thereto and rewrites the updated statistical information to the same address of the memory unit 71. In this way, the adder 81 is a device that adds data to the read data. Addition of the adder 81 is performed only when the search unit 51*a* has hit. The adder 81 adds plus 1 when the statistical information is the number of packets, and adds a packet size described in the header of the packet to the read data when the statistical information is the packet size. Here, it is necessary to compare the data read from the memory unit 71 with the search key for the hit/miss determination. Accordingly, the operation of the adder 81 is controlled by a hit signal of the comparator 63 of the search unit 51*a*.

The statistical information is accumulated in the memory unit 71 through this series of operations.

Similarly to the Poco Watcher 11*a* in the example illustrated in FIG. 5, the Poco Watcher 11*b* in the example illustrated in FIG. 6 includes a search unit 51*b*, a statistical information processing unit 52*b*, and an arithmetic operation unit 53*b*. In the example illustrated in FIG. 6, the memory unit 62 of the search unit 51*b* and the memory unit 91 of the statistical information processing unit 52*b* are integrally formed. Accordingly, by writing data for statistic information to the same row as an action of the memory cell array 621 for search in the memory cell array 911 for statistical information, functions (for example, the above-mentioned routing control) equivalent to those in the example illustrated in FIG. 5 can be implemented. As specific operations, the hash generator 61 inputs data (a search key) such as a destination input from the outside to a hash function to reduce the number of bits. The reduced data is used as an address of the memory (the memory unit 62 and the memory unit 91). When an action as a search result is input to data in the memory, a search operation can be implemented. When an action is read from the memory cell array 621 on the search unit 51*b* side, statistical data described in the same row in the memory cell array 911 on the statistical information processing unit 52*b* side is read. When the search result indicates a hit, the arithmetic operation unit 53 updates the read statistical information and rewrites the updated statistical information to the same row in the memory cell array 911 on the statistical information processing unit 52*b* side. On the other hand, when statistical information is read, a search key is input and statistical information stored in the address corresponding to the search key in the statistical information accumulated in the memory cell array 911 is read.

Figure 7:
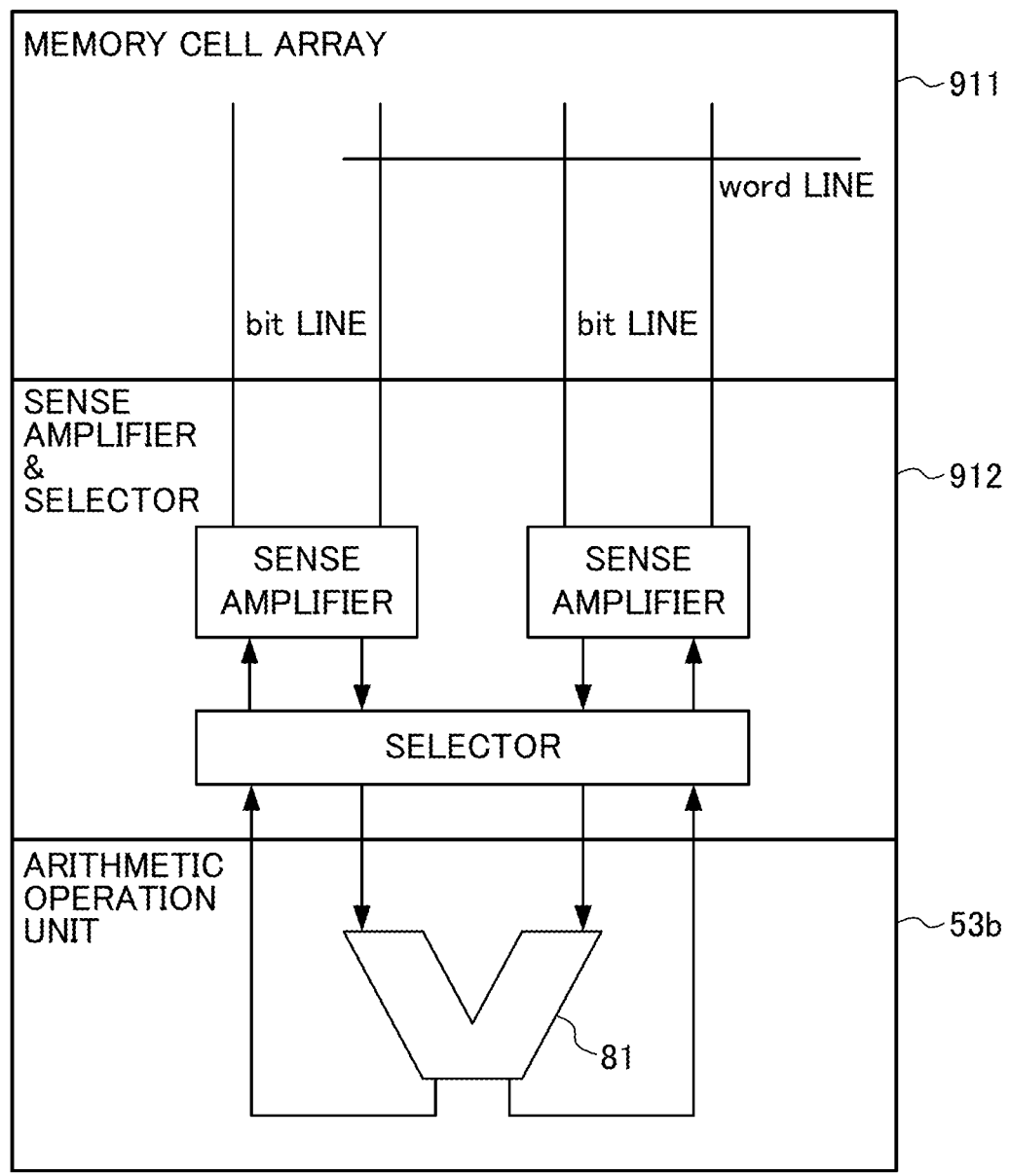
FIG. 7 is an enlarged view of a memory cell array, a sense amplifier & selector, and an arithmetic operation unit in the Poco Watcher in the example illustrated in FIG. 6.

FIG. 7 illustrates an enlarged view of the memory cell array 911, the sense amplifier & selector 912, and the arithmetic operation unit 53b in the Poco Watcher 11b in the example illustrated in FIG. 6. As illustrated in FIG. 7, each memory cell (a memory cell constituted by a word line and two bit lines) configuring the memory cell array 911 is connected to two sense amplifiers, a selector, and an adder 81. Accordingly, although not illustrated in the drawing, the adder 81 may be inserted into the memory unit 91. In this case, the time after being read and until being written can be reduced.

Figure 8:
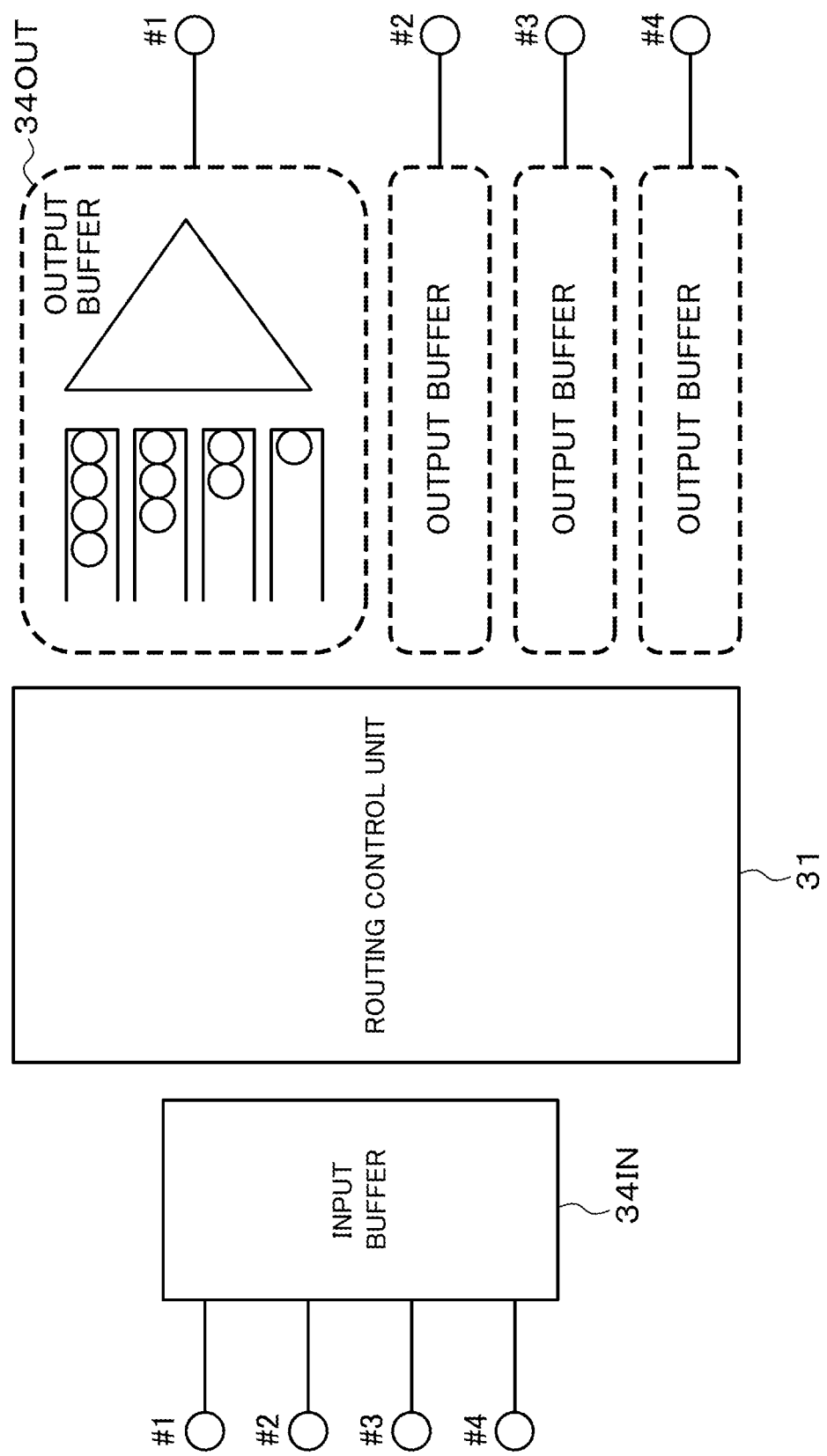
FIG. 8 is a schematic diagram describing a router function in which functions of the routing control unit and a buffer unit illustrated in FIG. 3 are combined.

FIG. 8 is a schematic diagram illustrating a router function in which the functions of the routing control unit 31 and the buffer unit 34 illustrated in FIG. 3 are combined. As described above, the routing control unit 31 can be implemented by the configuration of the example illustrated in FIG. 5 or the example illustrated in FIG. 6 in the Poco Watcher 11. Input data (such as a packet) for setting a route in the routing control unit 31 is input to an input buffer 341N of the buffer unit 34. On the other hand, data (such as a packet) of which a route has been set by the routing control unit 31 is input to an output buffer 34OUT (one of four output buffers 34OUT in the example illustrated in FIG. 8) connected to the output port to which one route has been set among a plurality of output ports (output ports #1 to #4 in the example illustrated in FIG. 8). Here, the output buffers 34OUT employ a configuration of a queue such that data with higher priority can be output earlier as illustrated in FIG. 8. That is, by dividing the output buffers 34OUT into FIFOs corresponding to the number of queues, FIFO queues input in the order of priorities can be controlled. The FIFO can be constituted by a standard memory.

As described above, in the Poco Watcher 11, the search engine (the search unit 51a illustrated in FIG. 5 or the search unit 51b illustrated in FIG. 6) is configured to include a standard memory (the memory unit 62 illustrated in FIG. 5 or 6), and the memory (the memory unit 71 illustrated in FIG. 5 or the memory unit 91 illustrated in FIG. 6) that stores the statistical information is also configured to include a standard memory. Accordingly, the network functions required for a data plane of a router or a network switch, that is, routing control, bandwidth control, traffic monitoring, buffering, and access control can be implemented by the one-chip Poco Watcher 11 (see FIG. 3).

Specifically, the routing control can be mainly implemented by the configuration (such as the search engine) illustrated in FIG. 5 or 6 as described above. That is, in the routing control, a destination address of an input packet is input to the search units 51a and 51b, and a packet is output to a specific output buffer 34OUT (see FIG. 8) in response to an action output from the search units 51a and 51b.

The bandwidth control can be implemented by the FIFO queue of the output buffer 34OUT illustrated in FIG. 8 as described above. That is, an amount of data which is output is limited by the FIFO provided in the output buffer 34OUT. When an amount of data input from the input buffer 341N is larger than an amount of data output, data is accumulated in the FIFO of the output buffer 34OUT.

The traffic monitoring can be implemented by analyzing statistical information stored in the memory unit 71 illustrated in FIG. 5 or the memory unit 91 illustrated in FIG. 6. That is, the traffic monitoring is performed by reading data stored in the memory unit 71 of the statistical information processing unit 52a or the memory unit 91 of the statistical information processing unit 52b and checking data values thereof. For example, whether an amount of specific data is large, whether an amount of specific data has increased rapidly, or the like is checked from the read data. An entity of the checking operation is, for example, the CPU 13 illustrated in FIG. 1.

The buffer can be implemented by the FIFO or the like as described above (see FIG. 8). That is, the buffer temporarily stores data until a route of an input packet is determined. Similarly to the bandwidth control, data is accumulated in the FIFO until being output.

The access control (filtering) can be implemented by a search engine. Details of the access control will be described later with reference to FIG. 10.

The above description is summarized as follows. The information processing system according to this embodiment can easily realize extension of the network functions by only connecting the Poco Watcher 11 configured as a single chip to the network processor 12.

Figure 14:
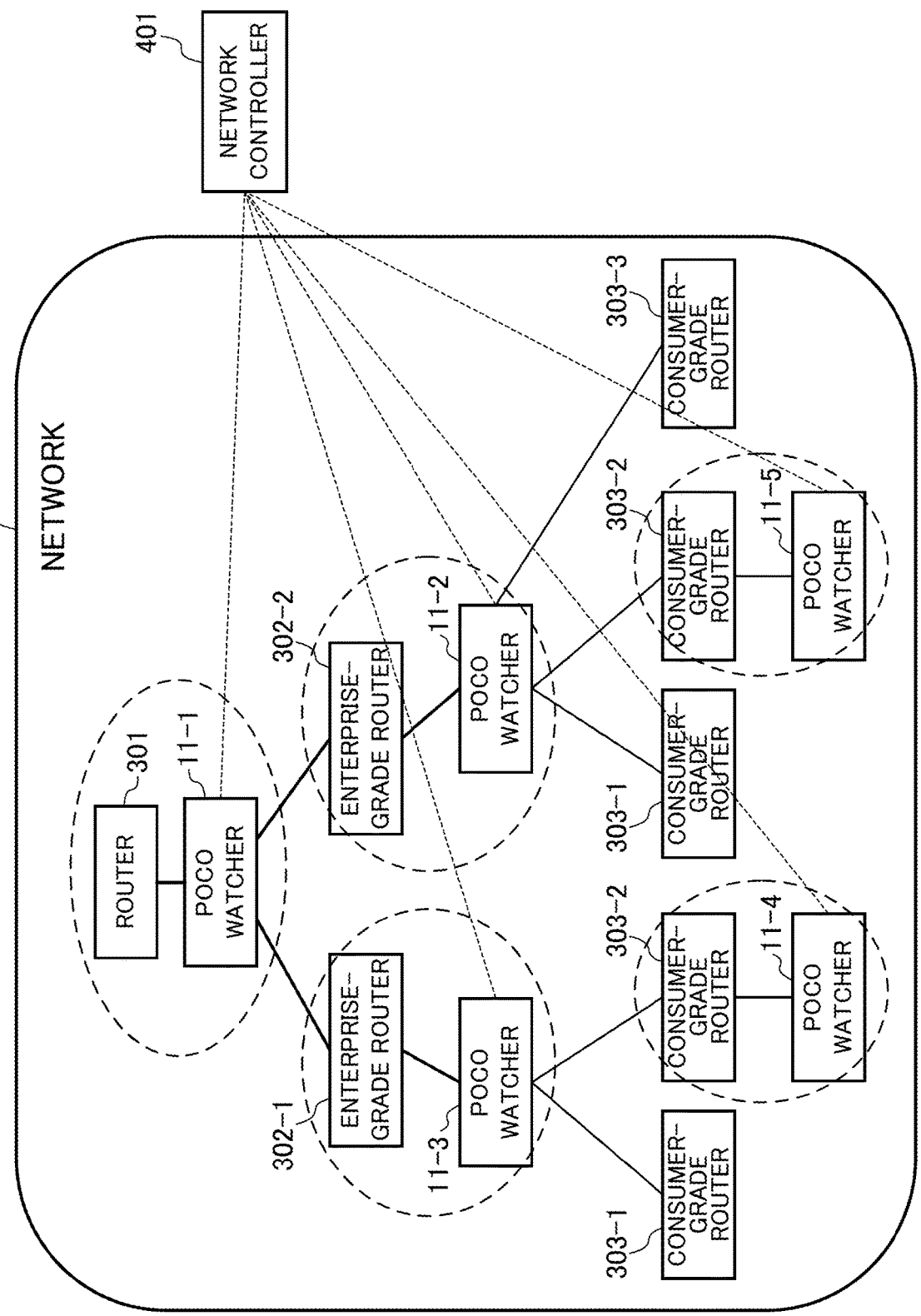
FIG. 14 is a block diagram illustrating a configuration example of the information processing system according to the embodiment of the invention which is different from the example illustrated in FIG. 1, FIGS. 2A and 2B, or FIGS. 13A and 13B.

Specifically, in the related art, a packet input from the outside is input from a predetermined communication device (for example, the communication device 14a in FIG. 14), a destination thereof is determined by the network processor 12 serving as a switch chip, and the packet is output to another communication device (for example, the communication device 14b in FIG. 14) or the same communication device (for example, the communication device 14a in FIG. 14). In order to extend the network functions such as routing control, bandwidth control, access control, traffic monitoring, and buffering, a special memory (the TCAM 501 or the SRAM 502) was required in addition to the DRAM 503 in FIG. 14.

On the other hand, in the information processing system according to this embodiment, it is possible to easily realize extension of the network functions by only connecting the Poco Watcher 11 to the network processor 12. In the Poco Watcher 11, the network functions such as routing control, bandwidth control, access control, traffic monitoring, and buffering are implemented by a single chip.

For example, when the information processing system has the configuration example illustrated in FIG. 2A, the Poco Watcher 11 is interposed between the communication device 14a and the network processor 12. In this case, the constituent part in the example illustrated in FIG. 5 or the example illustrated in FIG. 6 in the Poco Watcher 11 accumulates statistical information of a packet and outputs the statistical information in response to a request from the CPU 13. The CPU 13 determines whether a flow is biased on the basis of the statistical information. This determination result is fed back to the network processor 12 serving as a switch chip. The network processor 12 controls selection of a port from which the packet is output on the basis of the feedback information. In this way, the routing control is implemented by the Poco Watcher 11. In this case, the Poco Watcher 11 can also be used as a buffer that temporarily stores a packet input from the outside. The Poco Watcher 11 can also be used as a buffer at the time of outputting a packet. In this way, the bandwidth control of limiting an amount of data to be output is implemented by the Poco Watcher 11.

For example, when the information processing system has the configuration example illustrated in FIG. 1, the Poco Watcher 11 is disposed on the network processor 12 side and thus can complement the performance of the network processor 12. Accordingly, extension of a buffer size, extension of statistical information, extension of routing control, and the like can be realized as extension of the network functions of the network processor 12. Here, the extension of statistical information means that, for example, a function of storing only statistical information for each input port is extended to a function of storing statistical information for each flow. By this extension of statistical information, the number of types of statistical information increases and thus fine control is possible.

For example, the information processing system may have the configuration example illustrated in FIG. 2B for applications of monitoring only packets input from a WAN which is an external network which is not illustrated or which are output to the WAN side.

While an embodiment of the invention has been described above, the invention is not limited to the embodiment, and modification, improvements, and the like within a range in which the object of the invention can be achieved are included in the invention.

For example, the search engine is used for various applications. Specifically, the search engine can be applied for pattern authentication such as face authentication. When the search engine is applied in this way, a bit width of an input search key depends on the applications. Accordingly, by employing a method of increasing a bit width of a search key, it is possible to cope with all applications, which may seem to be advantageous. However, this method has a problem in that the time for inputting a search key is elongated and system performance deteriorates as a result. A memory capacity for comparison with the search key is necessary inside a device and extra resources are consumed. A problem that the number of entries decreases for the same memory capacity also occurs.

The search engine in the above-mentioned embodiment, that is, the search unit 51a in the example illustrated in FIG. 5 or the search unit 51b in the example illustrated in FIG. 6, has difficulty in solving such problems. Therefore, in order to solve these problems, a search engine capable of switching the configuration thereof using a mode register can be employed. Accordingly, the number of entries becomes a half and the number of bits of a search key doubles. By switching the configuration depending on applications, it is possible to provide configurations which are suitable for various types of applications using a single device (the Poco Watcher 11).

Figure 9:
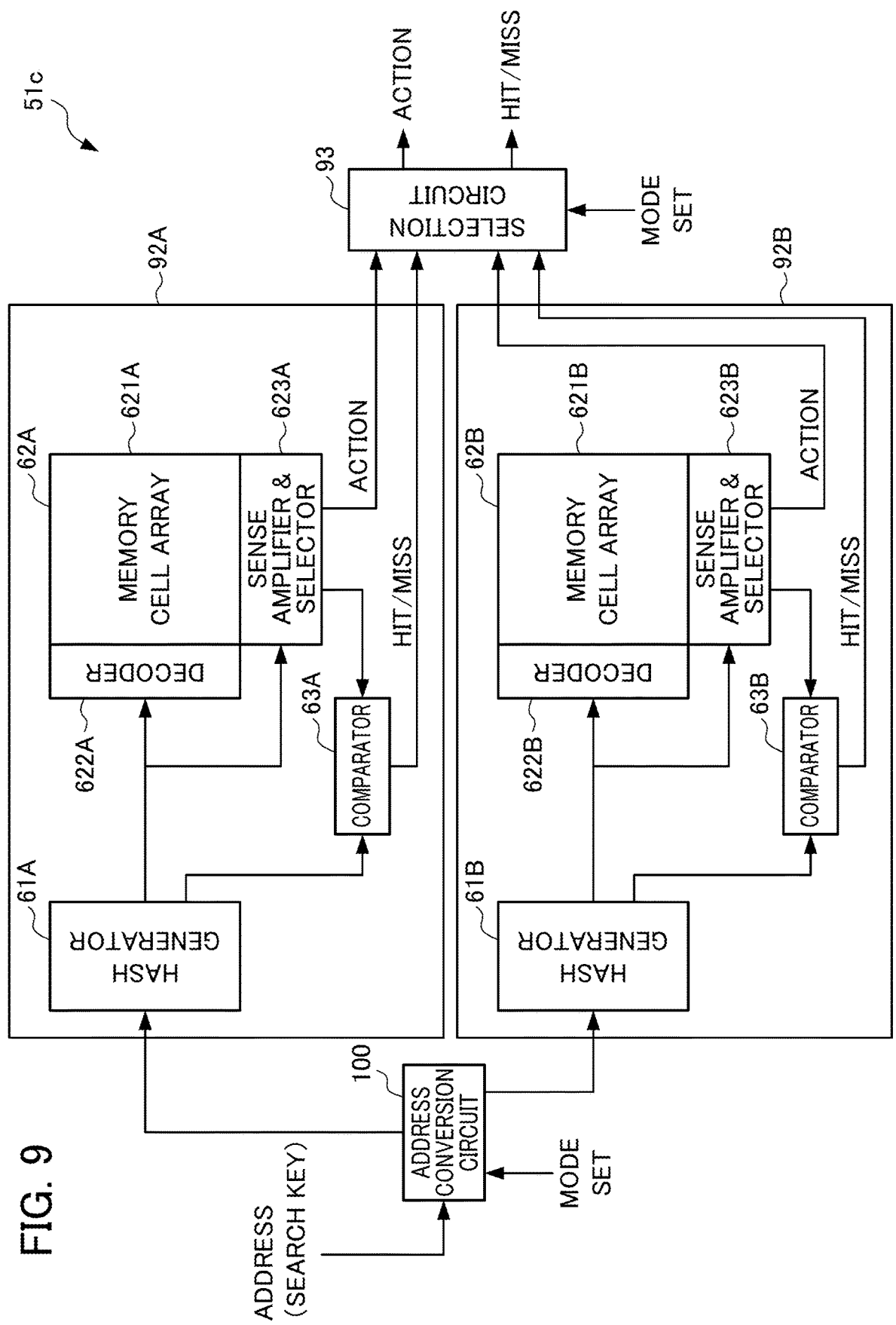
FIG. 9 is a diagram illustrating an example of a hardware configuration of a search engine in the Poco Watcher of the information processing system illustrated in FIG. 1 or FIGS. 2A and 2B which is different from the examples illustrated in FIGS. 5 and 6.

That is, a search engine that can switch between the configurations is illustrated in FIG. 9. That is, FIG. 9 illustrates an example of a hardware configuration of the search engine in the Poco Watcher 11 which is different from the examples illustrated in FIGS. 5 and 6.

As illustrated in FIG. 9, a search unit 51c includes an address conversion circuit 100, a main search unit 92A, a main search unit 92B, and a selection circuit 93. Here, the main search unit 92A and the main search unit 92B basically have the same functions and configurations as the search unit 51a in the example illustrated in FIG. 5 and thus detailed description thereof will not be repeated.

In the example illustrated in FIG. 9, a search engine is divided into two parts of the main search unit 92A and the main search unit 92B. A mode set (a signal of a mode register) is input to the address conversion circuit 100 and the selection circuit 93. That is, an input address is switched by the mode set in the address conversion circuit 100, and a search result is switched by the mode set in the selection circuit 93.

For example, in the example illustrated in FIG. 9, when the number of entries doubles, the address conversion circuit 100 inputs the same search key to the two divided search engines, that is, the main search unit 92A and the main search unit 92B. Among actions output from the main search unit 92A and the main search unit 92B, an action result in which a hit signal is activated is selected and output as a search result by the selection circuit 93. When miss signals are output from the main search unit 92A and the main search unit 92B, the selection circuit 93 outputs a miss.

For example, the example illustrated in FIG. 9, when the bit width of a search key doubles, the address conversion circuit 100 divides the input search key into first half bits and second half bits, inputs the first half bits to the main search unit 92A, and inputs the second half bits to the main search unit 92B. When hit signals are activated from the main search unit 92A and the main search unit 92B, the selection circuit 93 outputs an action result to be a hit. When a miss signal is output from at least one of the main search unit 92A and the main search unit 92B, the selection circuit 93 outputs a miss.

In the example illustrated in FIG. 9, the search engine is divided into two parts, but the number of divided parts of the search engine is not limited thereto and may be, for example, four. When the search engine is divided into four parts, the number of entries can be switched to one time, double, and quadruple.

Now, the access control (filtering) using a search engine will be described. The filtering is roughly classified into a black list method and a white list method. The black list method is a method of outputting information other than information of search keys including existing bit strings described in a black list. The white list method is a method of outputting information of search keys described in a white list. In the black list method, it is assumed that bit strings in which higher three bits of a search key of four bits are "000" are described in a black list. In this case, both search results in which the search keys are "0001" and "0000" should be excluded. In this case, "0001" and "0000" may be input as a search key to the search engine two times and search results may be individually output, but both search results of "0001" and "0000" can be output by providing a mask function to the search key and only inputting "000*" of which the lower 1 bit has been masked as a search key one time. In this way, when the black list method is employed, it is possible to reduce a process time or a process load of the search engine by providing a mask function to the search key.

There is also an application of outputting a high-ranked candidate. For example, there is an application of searching for a way to an art gallery and outputting a plurality of candidates as search results. Even when a plurality of candidates are output as search results, a mask function can be input to the search key.

Figure 10:
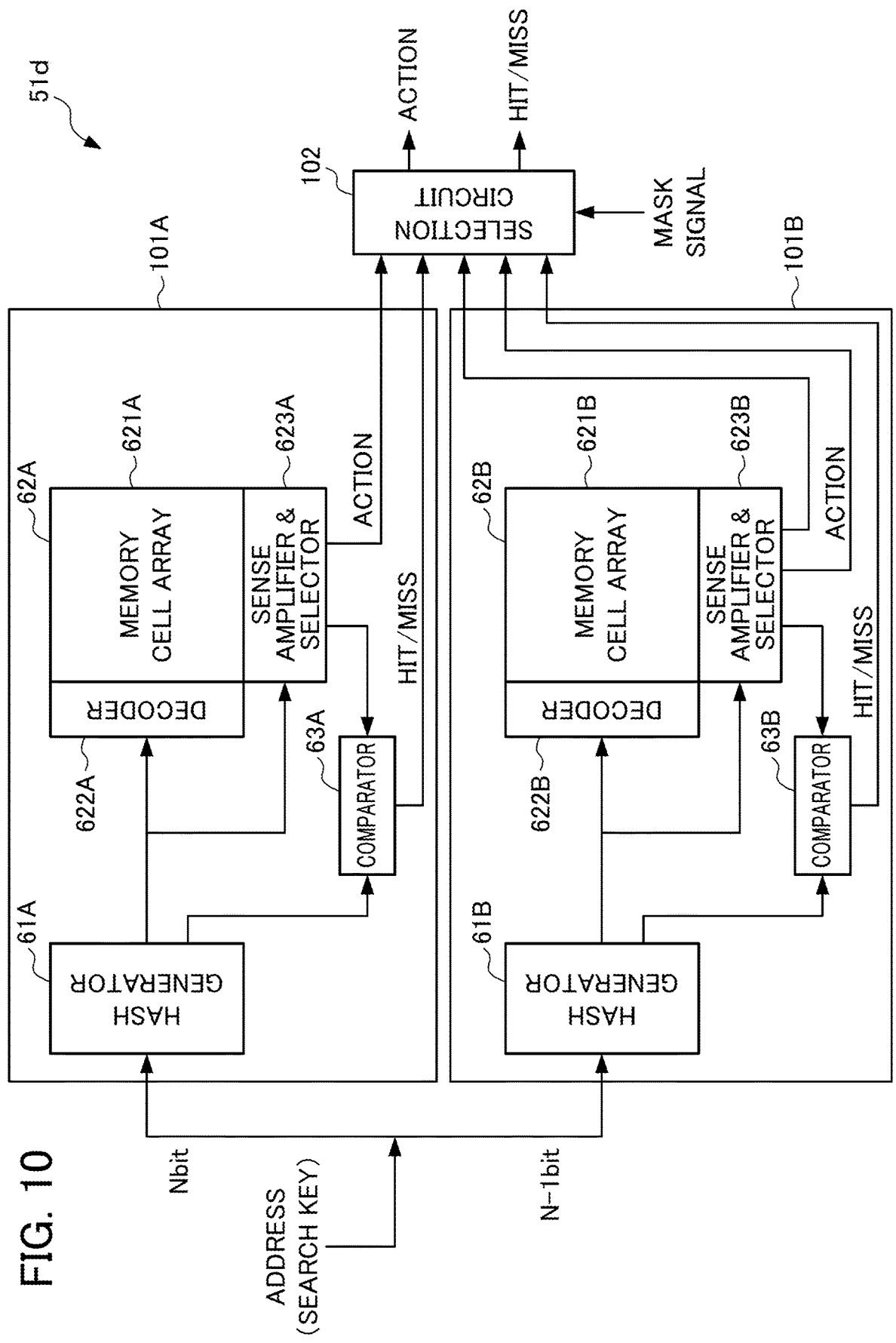
FIG. 10 is a diagram illustrating an example of the hardware configuration of the search engine in the Poco Watcher of the information processing system illustrated in FIG. 1 or FIGS. 2A and 2B which is different from the examples illustrated in FIGS. 5, 6, and 9.

FIG. 10 illustrates an example of the hardware configuration of the search engine in the Poco Watcher 11 which is different from the examples illustrated in FIGS. 5, 6, and 9. As illustrated in FIG. 10, a search unit 51d includes a main search unit 101A, a main search unit 101B, and a selection circuit 102. Here, the main search unit 101A and the main search unit 101B basically have the same functions and configurations as the search unit 51a in the example illustrated in FIG. 5 and thus detailed description thereof will not be repeated. When a search key is masked, the number of bits of an input search key decreases. However, since it is necessary to construct a configuration capable of outputting a plurality of actions as a search result, the configuration illustrated in FIG. 10 is employed. Here, when a mask signal is activated, the selection circuit 102 outputs a result from the search engine corresponding to a search table corresponding to the mask.

As described above with reference to FIG. 9 or 10, it is possible to provide a device (the Poco Watcher 11) which is suitable for various applications by dividing an internal search engine, changing an input search key, and changing determination as a search result.

In this way, the method of changing specifications by switching the functions of a search engine using a mode set or the like is suitable as the method of coping with various applications, but the invention is not limited to the method. For example, a method of using a plurality of LSIs (Poco Watchers 11) on which a single search engine is mounted may be employed as another method.

Figure 11:
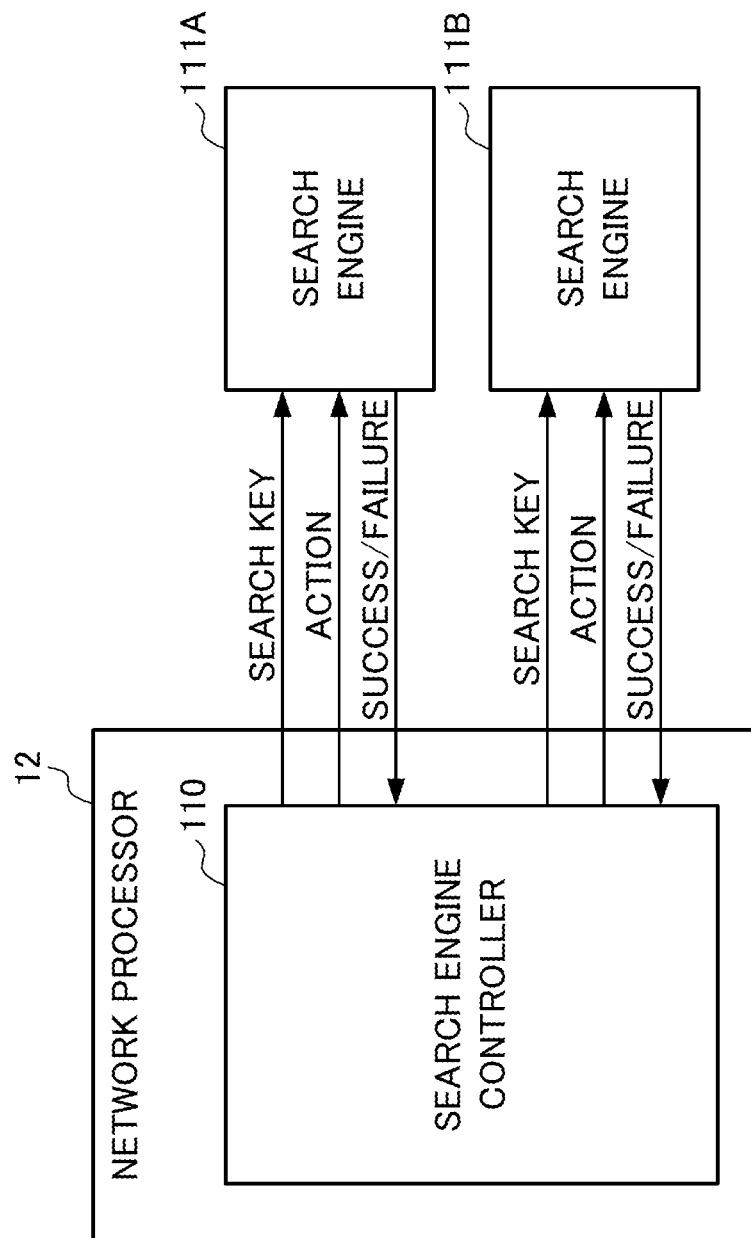
FIG. 11 is a diagram illustrating a configuration example of an information processing system according to an embodiment of the invention, where the information processing system employs two search engines.

FIG. 11 illustrates a configuration example of an information processing system according to an embodiment of the invention, where the information processing system employs two search engines. In the example illustrated in FIG. 11, search engines 111A and 111B are connected to a search engine controller 110 of a network processor 12. By employing this configuration, the capacity of a search table, that is, the number of entries, can double. At the time of search, search keys are simultaneously input to the two search engines 111A and 111B. The search engine controller 110 confirms the search results output from the two search engines 111A and 111B and uses one of the two search engines 111A and 111B which has hit. It is possible to enlarge a search table through this operation.

Figure 12:
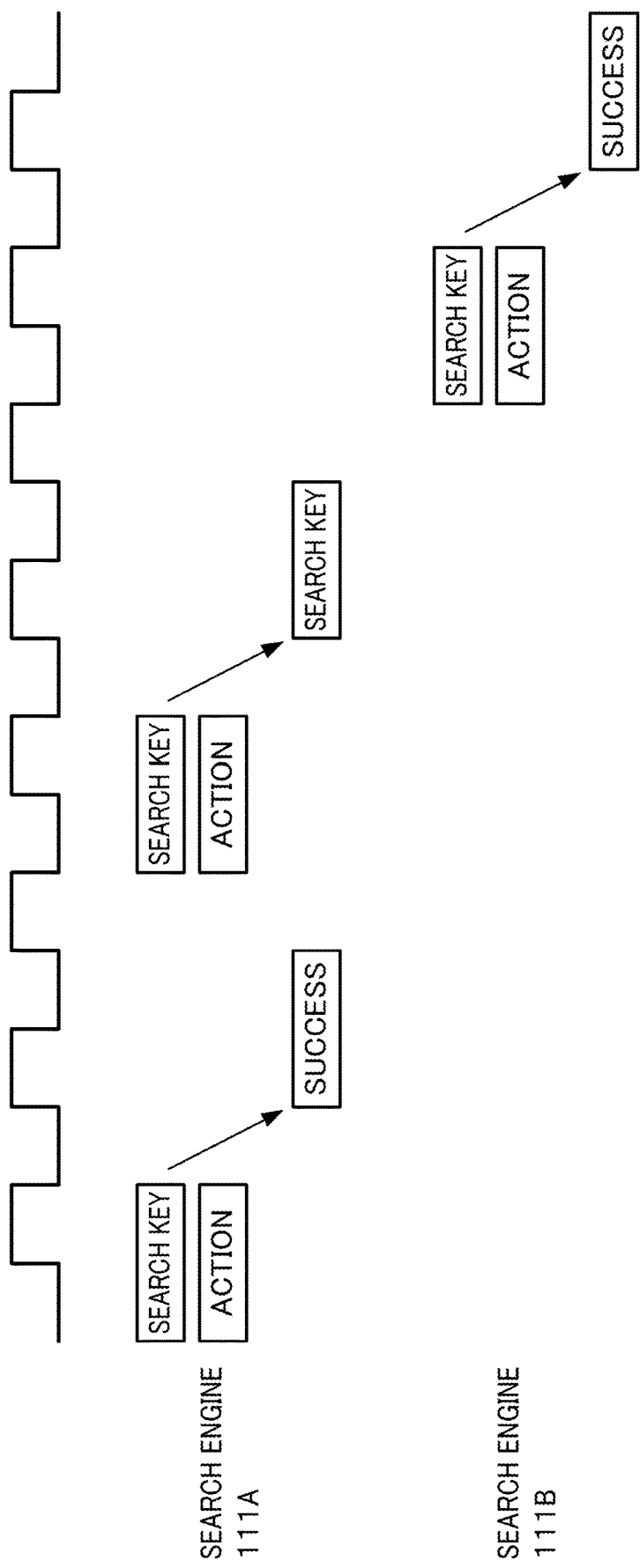
FIG. 12 is a diagram illustrating an operation example of the information processing system illustrated in FIG. 11.

When a search table with a large capacity is constructed, different tables are written to the search engine 111A and the search engine 111B. Accordingly, a situation in which both the search engines 111A and 111B hit simultaneously does not occur at all. When a large-capacity table is constructed, writing of a table is first performed on the first search engine 111A, as illustrated in FIG. 12. When this writing has succeeded, writing of a table is not performed on the second search engine 111B. On the other hand, when writing of a table to the first search engine 111A fails, writing of a table to the second search engine 111B is performed.

Extension of a search table using a plurality of search engines (two search engines 111A and 111B in the example illustrated in FIGS. 11 and 12) can be implemented by outputting a determination result of whether writing has been completed and "succeeded" or "failed" from the search engines (two search engines 111A and 111B in the example illustrated in FIGS. 11 and 12).

The search engine controller 110 may determine whether writing has succeeded. However, since the same functions as the search engines 111A and 111B are provided in the search engine controller 110, resources become insufficient in many cases. The resources are wasted, which cannot be said to be a good method. Conversely, a search table can be simply extended by using a writing completion signal. An example in which a search table is extended to double has been described above, but the invention is not limited thereto. When the number of search engines (LSIs) increases, it is possible to easily realize extension of the capacity of the search table in proportion thereto.

Figure 13A:
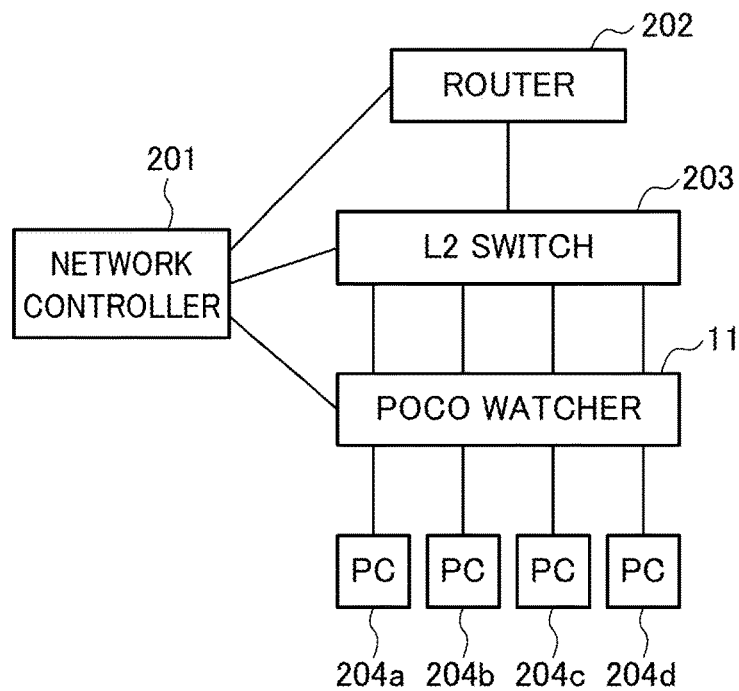
FIGS. 13A and 13B are block diagrams illustrating a configuration example of the information processing system according to the embodiment of the invention which is different from the example illustrated in FIG. 1 or FIGS. 2A and 2B.
Figure 13B:
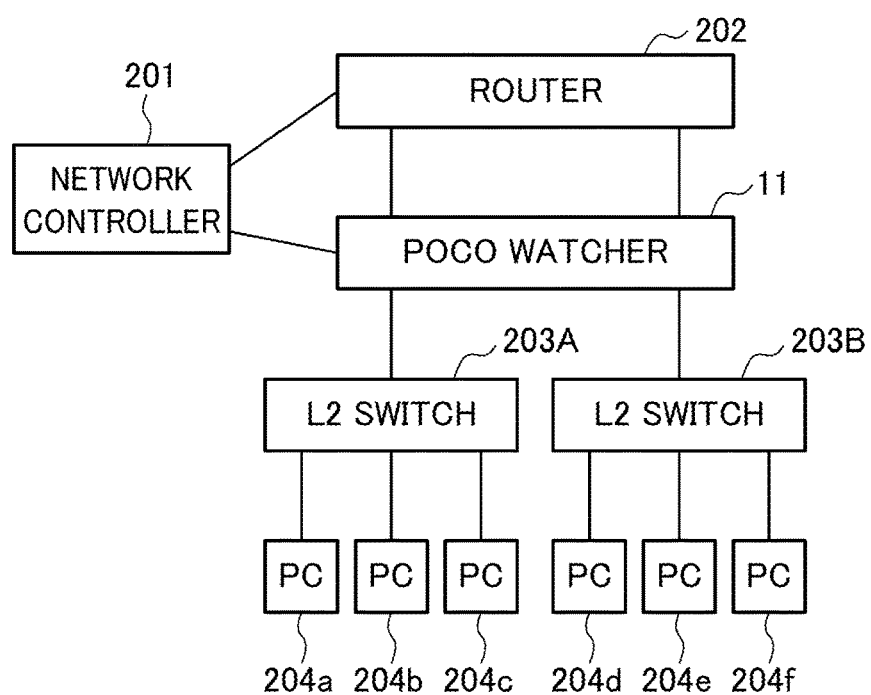

In the above-mentioned embodiment, the Poco Watcher 11 is mounted on a board in a server or a PC (one casing) along with a CPU or a network controller, but the mounting example is not particularly limited thereto. For example, as illustrated in FIGS. 13A and 13B or FIG. 14, a configuration in which the Poco Watcher 11 is configured as one device (one casing) and is connected to another device (one casing) may be employed. FIGS. 13A and 13B are block diagrams illustrating a configuration example of the information processing system according to the embodiment of the invention which is different from the example illustrated in FIG. 1 or FIGS. 2A and 2B. In the information processing system in the example illustrated in FIG. 13A, the Poco Watcher 11 is connected between an L2 switch 203 connected to a router 202 and a plurality of PCs 204a to 204d. A network controller 201 is connected to the router 202, the L2 switch 203, and the Poco Watcher 11. In the information processing system in the example illustrated in FIG. 13B, the Poco Watcher 11 is connected between a router 202 and two L2 switches 203A and 203B. The network controller 201 is connected to the router 202 and the Poco Watcher 11. A plurality of PCs 204a to 204c are connected to the L2 switch 203A. A plurality of other PCs 204d to 204f are connected to the L2 switch 203B.

FIG. 14 is a block diagram illustrating a configuration example of the information processing system according to the embodiment of the invention which is different from the example illustrated in FIG. 1, FIGS. 2A and 2B, or FIGS. 13A and 13B. In the information processing system in the example illustrated in FIG. 14, a router 301, enterprise-grade routers 302-1 and 302-2, and consumer-grade routers 303-1 to 303-3 are present as devices constituting a network N. A network controller 401 in the example illustrated in FIG. 14 is a device that looks down on information on the network N as a whole. That is, the information processing system in the example illustrated in FIG. 14 implements a software defined network (SDN). In order to implement the SDN, the network controller 401 needs to acquire states of the individual devices constituting the network N and to control the individual devices on the basis of the acquired information. Accordingly, in the related art, since a configuration in which the network controller 401 and the devices of the network N communicate directly with each other was employed which is not illustrated, it is very difficult to implement the SDN for the following reasons. The first reason is that the individual devices are provided by different makers. Furthermore, some devices support the SDN and some devices do not support the SDN. The second reason is that routers are further simplified, for example, by network function-virtualization (NFV) FV according to a future technical trend. Therefore, in the information processing system in the example illustrated in FIG. 14, Poco Watchers 11-1 to 11-5 are connected to the individual devices of the network N and the network controller 401 communicates with the Poco Watchers 11-1 to 11-5 (hereinafter collectively referred to as "Poco Watcher 11"). The Poco Watcher 11 performs traffic monitoring (collection of data) and performs a variety of control. That is, the Poco Watcher 11 transmits traffic data to the network controller 401 and receives control data from the network controller 401. In this way, the Poco Watcher 11 has a function of monitoring traffic of the connected individual device of the individual devices, acquiring data, and transmitting the acquired data to the network controller 401 and a function of receiving control information and controlling the connected individual device of the individual devices on the basis of the control information when data of the individual devices is analyzed and the control information for the individual devices is generated and transmitted by the network controller 401.

In other words, the memory device according to the invention can have the following configurations and can be embodied in various embodiments including the above-mentioned embodiment. That is, the memory device according to the invention may be a memory device (for example, the Poco Watcher 11 illustrated in FIG. 1 or FIGS. 2A and 2B) that is configured as single chip, in which the memory device allows at least routing control, bandwidth control, traffic monitoring, buffering, and access control of network functions to function (for example, the memory device has the functional configuration illustrated in FIG. 3). By employing the memory device having this configuration, it is possible to easily realize extension of a network function with low cost and low power consumption on the occasion of NFV or commodification of networks.

Here, the memory device may include: a search unit (for example, the search unit 51a or 51b illustrated in FIG. 5 or 6) that includes a first memory unit (for example, the memory unit 62 illustrated in FIG. 5 or 6) and performs a search operation of referring to an input search key for data stored in the first memory unit; a statistical information processing unit (for example, the statistical information processing unit 52a or 52b illustrated in FIG. 5 or 6) that correlates an address of the first memory unit with a search key which is hit by the search unit and includes a second memory unit (for example, the memory unit 71 illustrated in FIG. 5 or the memory unit 91 illustrated in FIG. 6) that stores statistical information of the address; and an arithmetic operation unit (for example, the arithmetic operation unit 53a or 53b illustrated in FIG. 5 or 6) that updates the statistical information whenever the search unit hits.

The search unit (for example, the search unit 51c illustrated in FIG. 9) may have a function of changing a bit width of a search key.

The search unit (for example, the search engines 111A and 111B illustrated in FIG. 11) may have a function of outputting a determination signal indicating whether writing of information has succeeded or failed.

The search unit (for example, the search unit 51d illustrated in FIG. 10) may selectively perform the access control using a white list method and the access control using a black list method.

The memory device may be provided to be connected to each individual device in an information processing system including individual devices (for example, the router 301, the enterprise-Grade routers 302-1 and 302-2, and the consumer-grade routers 303-1 to 303-3 which constitute the network N in FIG. 14) constituting a network and a network controller (for example, the network controller 401 illustrated in FIG. 14) controlling the individual devices, and the memory device (for example, the Poco Watchers 11-1 to 11-5 illustrated in FIG. 14) may have: a function of monitoring traffic of one connected individual device of the individual devices, acquiring data, and transmitting the acquired data to the network controller; and a function of receiving control information and controlling one connected individual device of the individual devices on the basis of the control information when data of the individual devices is analyzed and the control information for the individual devices is generated and transmitted by the network controller.

Figure 16:
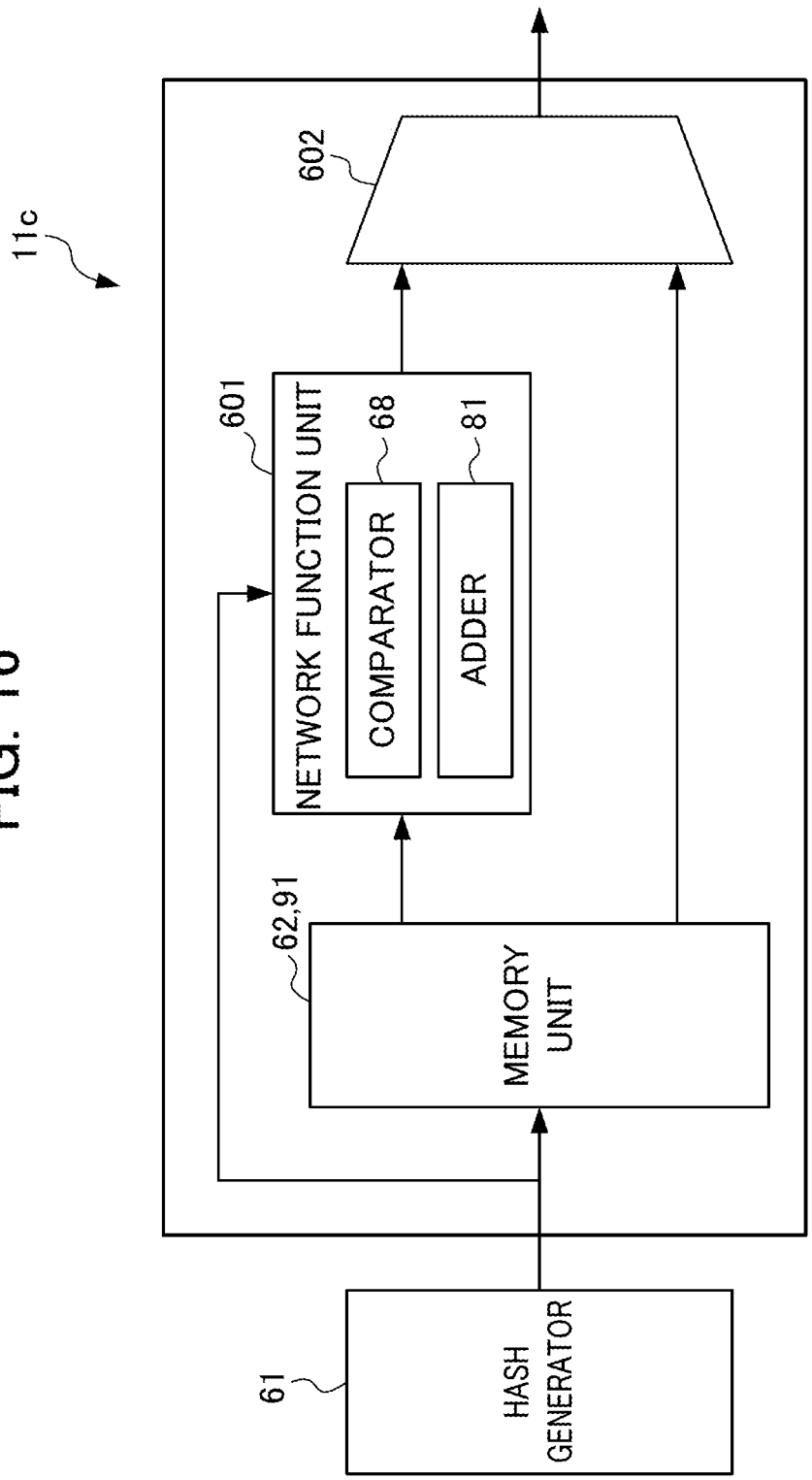
FIG. 16 is a block diagram illustrating another configuration example of the Poco Watcher of the information processing system illustrated in FIG. 1 or FIGS. 2A and 2B.

The Poco Watcher 11 can be embodied as a DDR DRAM dedicated for a network as described above, but may be embodied by selectively adding network functions to a general-purpose DDR DRAM as illustrated in FIG. 16. Here, a general-purpose DRAM refers to a DRAM which is standardized in the JEDEC.

A Poco Watcher 11c illustrated in FIG. 16 is formed in a DDR DRAM and has a configuration which is selectively usable for a network and for a general-purpose PC. A hash generator 61 is provided outside the DDR DRAM, and a memory unit 62 or 91 and a network function unit 601 such as a comparator 68 and an adder 81 are formed in the DDR DRAM. Here, the network function unit 601 has the functional configuration illustrated in FIG. 3. A selector 602 is provided in the DDR DRAM. That is, when the selector 602 is switched to an upper route in FIG. 16, that is, a route passing through the memory unit 62 or 91 and the network function unit 601 such as the comparator 68 and the adder 81, the Poco Watcher functions as a DDR DRAM for a network. On the other hand, when the selector 602 is switched to a lower route in FIG. 16, that is, a route from the memory unit 62 or 91 directly to the selector 602, the Poco Watcher functions as a general-purpose DDR DRAM. The selector 602 can be suitably mounted using at least one of a metal mask and an address key.

Figure 17:
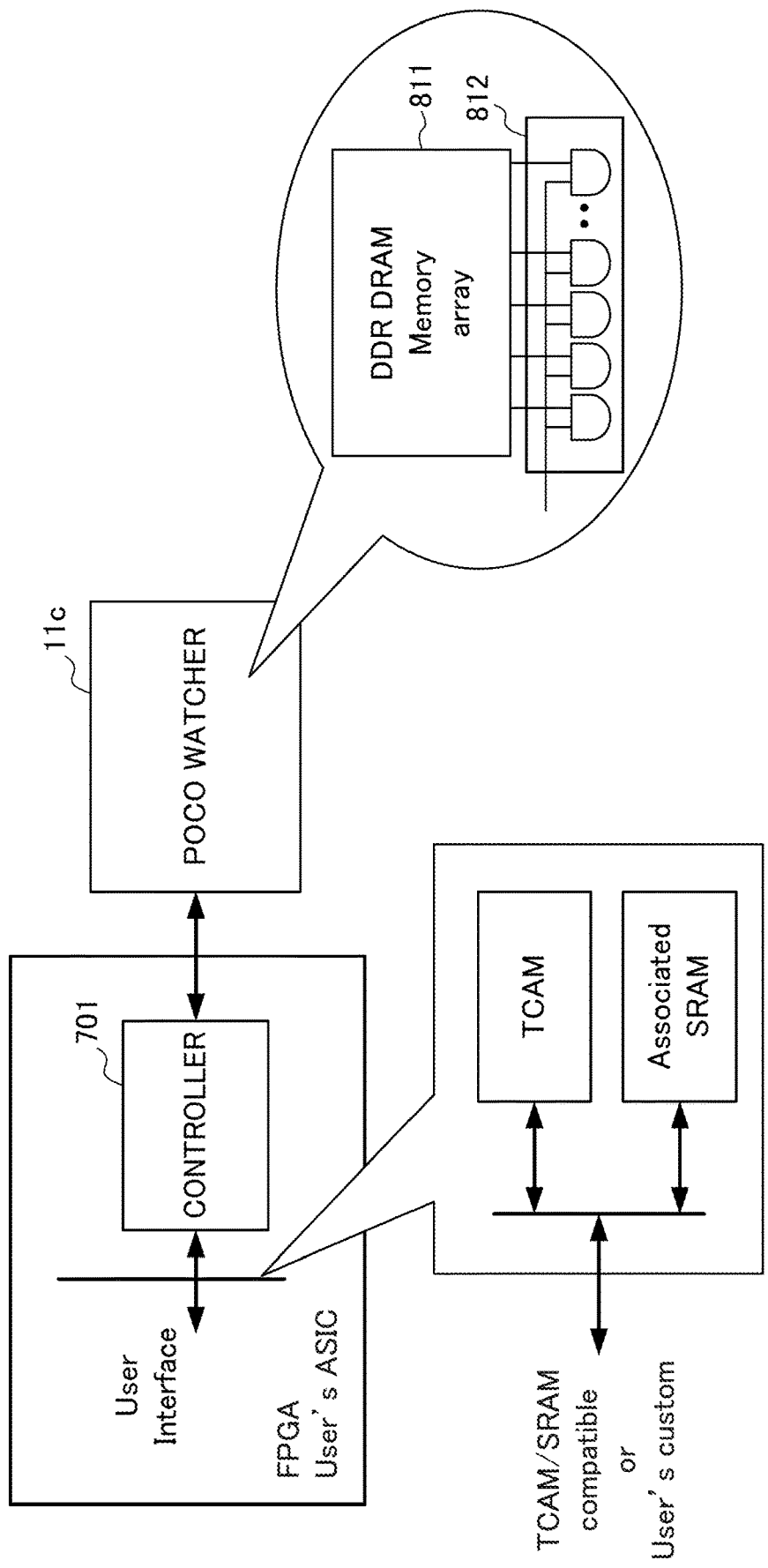
FIG. 17 is a diagram illustrating a connection state of the Poco Watcher illustrated in FIG. 16.

FIG. 17 is a diagram illustrating a connection state of the Poco Watcher 11c (which functions as a DDR DRAM for a network) illustrated in FIG. 16. As illustrated in FIG. 17, the Poco Watcher 11c (which functions as a DDR DRAM for a network) can be connected to a controller 701 as an IP of an FPGA or an ASIC. Accordingly, it is possible to implement a function capable of performing parallel comparison like a TCAM. Here, as illustrated in a lower-right part of FIG. 17, a general-purpose DRAM is originally provided with a comparator group 812 for use in a test mode in addition to a memory unit 811. The comparator group 812 without any change can be used for the network function unit 601 illustrated in FIG. 16.

Figure 18A:
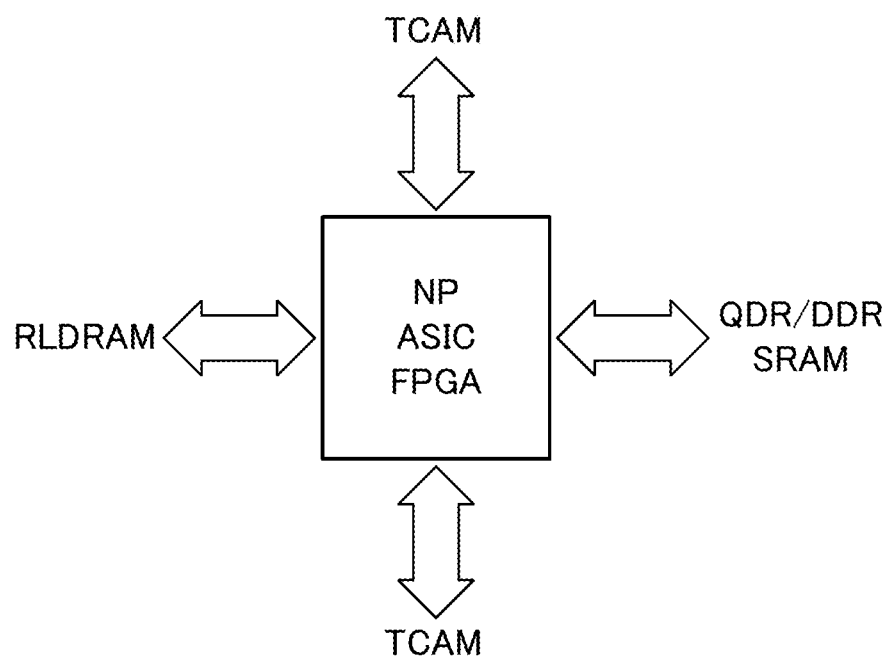
FIGS. 18A and 18B are diagrams illustrating comparison of the configuration example of the information processing system including the Poco Watcher illustrated in FIG. 16 with the configuration example of the information processing system according to the related art for implementing the network functions.
Figure 18B:
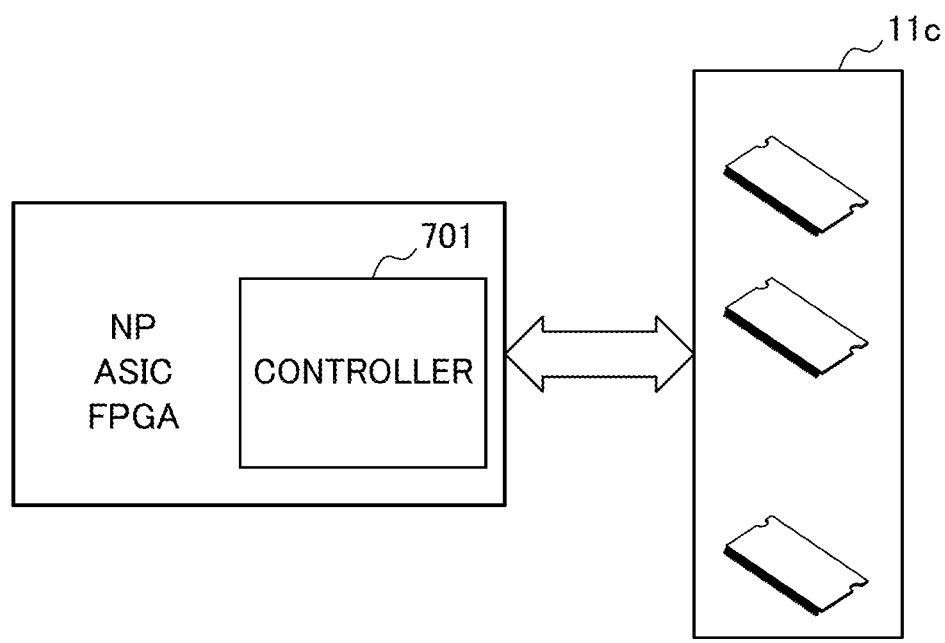

FIGS. 18A and 18B are diagrams illustrating comparison of the configuration example of the information processing system including the Poco Watcher 11c (which functions as a DDR DRAM for a network) illustrated in FIG. 16 with the configuration example of the information processing system according to the related art for implementing the network function.

FIG. 18A illustrates a configuration example of the information processing system according to the related art for implementing the network functions. As described above with reference to FIG. 15, in the information processing system according to the related art for implementing the network functions, the network functions are implemented by connecting a plurality of TCAMs, RLDRAMs, and QDR/DDR SRAMs to an NP, an ASIC, an FPGA, or the like. A plurality of TCAMs, RLDRAMs, and QDR/DDR SRAMs are components with high prices and high power consumption. Since it is predicted that prices of the components will not decrease due to a small market scale (no economies of scale), it is predicted that the components will have high prices. There is also a demerit that interfaces from an NP, an ASIC, an FPGA, or the like to the components are particularly necessary.

FIG. 18B illustrates a configuration example of the information processing system including the Poco Watcher 11c (which functions as a DDR DRAM for a network) illustrated in FIG. 16 to which the invention is applied. All the network functions (FIG. 3) are incorporated into the Poco Watcher 11c. The Poco Watcher 11c is formed on a general-purpose DDT2(3, 4) DRAM. That is, the selector 602 (FIG. 16) is implemented using at least one of a metal mask (a wired layer) and an address key (a mode register), and the DDT2 DRAM can be switched into either for a general-purpose PC or for a network. Here, since the comparator group 812 is provided in the DDT2 DRAM for use in a test mode in advance (FIG. 17), it is not necessary to provide a new element by using the comparator group for the network function unit 601. Accordingly, it is possible to decrease a memory price for a network and to implement an information processing system with low prices and low power consumption due to a price premium of a general-purpose DDR. Since the network functions are integrated on the Poco Watcher 11c, an interface between the Poco Watcher 11c and the controller 701 of an IP of an NP, an ASIC, an FPGA, or the like has only to be provided as illustrated in FIGS. 18A and 18B. That is, the interfaces can be unified.

EXPLANATION OF REFERENCE NUMERALS 11, 11a, 11b, 11c ... Poco Watcher, 12 ... network processor, 31 ... routing control unit, 32 ... bandwidth control unit, 33 ... traffic monitoring unit, 34 ... buffer unit, 35 ... access control unit, 36 ... main control unit, 37 ... clustering unit, 38 ... ranking unit, 39 ... mining unit, 51a, 51b, 51c, 51d ... search unit, 52a, 52b ... statistical information processing unit, 53a, 53b ... arithmetic operation unit, 62 ... memory unit, 71 ... memory unit, 81 ... adder, 91 ... memory unit, 92A, 92B, 101A, 101B ... main search unit, 111A, 111B ... search engine, 601 ... network function unit, 602 ... selector, 812 ... comparator group

The invention claimed is:

1. A memory device that is configured as single chip to achieve routing control, bandwidth control, traffic monitoring, buffering, and access control of network functions, the memory device comprising:
a search unit that includes a first memory unit and performs a search operation by searching, from the first memory unit, a piece of data corresponding to an input search key, wherein the search unit selectively performs the access control using a white list method and the access control using a black list method;
a statistical information processing unit that includes a second memory unit that stores statistical information including the input search key, with which the piece of data has been successfully searched by the search unit, and an address of the piece of data in the first memory unit; and
an arithmetic operation unit that updates the statistical information when the search unit successfully searches the pieces of data corresponding to the input search key.

2. The memory device according to claim 1, wherein the address is obtained by converting the search key into a hash value.

3. The memory device according to claim 1, wherein a bit length of the address is shorter than a bit length of the search key.

4. The memory device according to claim 1, wherein the memory device further compares the input search key and a search key read from the first memory unit, thereby determining whether the search operation of the search unit is correct or not.

5. The memory device according to claim 1, wherein the first memory unit and the second memory unit are integrally formed, and
the statistical information corresponding to the piece of data of the first memory unit is stored in a same line of the second memory unit as a line of the first memory unit storing the piece of data.

6. The memory device according to claim 1, further comprising an address conversion circuit for dividing the input search key into a plurality of divided input search keys,
wherein the memory device includes a plurality of first memory units, and
the search unit respectively searches, from the plurality of first memory units, the plurality of divided input search keys, thus realizing a function to vary a bit length of the input search key.

7. The memory device according to claim 1,
wherein the search unit outputs a determination signal indicating whether writing of information has succeeded or failed.

8. The memory device according to claim 1, wherein, in an information processing system including individual devices constituting a network and a network controller controlling the individual devices, the memory device is provided and connected to each of the individual devices, and
wherein the memory device monitors traffic of one connected individual device of the individual devices, acquiring data, and transmits the acquired data to the network controller; and
when the network controller analyzes data of each of the individual devices and generates and transmits control information for the individual device, the memory device receives the generated control information and controls the individual device connected with the memory device on the basis of the control information.

9. The memory device according to claim 8, wherein each of the individual devices constituting the network is a router.

10. The memory device according to claim 8, wherein the information processing system is an SDN (Software Defined Network).

11. The memory device according to claim 1, further comprising:
a memory unit;
a network function unit that implements the network functions; and
a selector unit that switches between a first route including the memory unit and the network function unit and a second route including the memory unit.

12. The memory device according to claim 11, wherein the selector unit is implemented using at least one of a metal mask and an address key.

13. The memory device according to claim 11, wherein the network function unit includes a comparator group for a test mode of the memory unit.

* * * * *